(12) United States Patent
Ozaki

(10) Patent No.: US 8,729,619 B2
(45) Date of Patent: *May 20, 2014

(54) SEMICONDUCTOR DEVICE AND FABRICATING METHOD OF THE SAME

(75) Inventor: Yasutaka Ozaki, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 123 days.

This patent is subject to a terminal disclaimer.

(21) Appl. No.: 13/294,554

(22) Filed: Nov. 11, 2011

(65) Prior Publication Data
US 2012/0056300 A1 Mar. 8, 2012

Related U.S. Application Data

(63) Continuation of application No. 11/293,893, filed on Dec. 5, 2005, now Pat. No. 8,125,014, which is a continuation-in-part of application No. 11/093,242, filed on Mar. 30, 2005, now abandoned.

(30) Foreign Application Priority Data

Dec. 3, 2004 (JP) .................................. 2004-351905
Sep. 20, 2005 (JP) .................................. 2005-272595

(51) Int. Cl.
H01L 29/76 (2006.01)
(52) U.S. Cl.
USPC .......................................... 257/306; 257/758
(58) Field of Classification Search
USPC ................................................. 257/306, 758
See application file for complete search history.

(56) References Cited

U.S. PATENT DOCUMENTS

| 5,689,126 | A  | * | 11/1997 | Takaishi ..................... 257/306 |
| 5,717,233 | A  | * | 2/1998  | Fujii et al. .................. 257/295 |
| 6,169,305 | B1 | * | 1/2001  | Takai et al. .................. 257/306 |
| 6,249,014 | B1 |   | 6/2001  | Bailey |
| 6,407,422 | B1 |   | 6/2002  | Asano et al. |
| 6,509,601 | B1 | * | 1/2003  | Lee et al. .................... 257/310 |
| 6,734,459 | B2 | * | 5/2004  | Weinrich ..................... 257/71 |
| 6,734,477 | B2 |   | 5/2004  | Moise et al. |
| 7,190,015 | B2 |   | 3/2007  | Natori et al. |
| 2003/0218202 | A1 |   | 11/2003 | Sato |
| 2003/0222299 | A1 |   | 12/2003 | Miura |
| 2004/0084709 | A1 | * | 5/2004  | Kim et al. .................... 257/306 |

(Continued)

FOREIGN PATENT DOCUMENTS

JP 10-12617 1/1998
JP 2003-068993 3/2003

(Continued)

OTHER PUBLICATIONS

Japanese Office Action for Japanese Patent Application No. 2005-272595, which was mailed by the Japanese Patent Office on Jun. 8, 2010.

(Continued)

Primary Examiner — Eugene Lee
(74) Attorney, Agent, or Firm — Fujitsu Patent Center

(57) ABSTRACT

Openings are formed by lithography and subsequent dry etching at the portions of a first protective film which correspond to connecting holes of second plugs which will be described later, namely at the portions thereof which align with first plugs, wherein the openings have a diameter greater than that of connecting holes by about 0.4 μm.

6 Claims, 20 Drawing Sheets

(56) References Cited

U.S. PATENT DOCUMENTS

2004/0089894 A1 5/2004 Sashida
2004/0159874 A1 8/2004 Tsuchiya et al.
2005/0274999 A1 12/2005 Itokawa et al.

FOREIGN PATENT DOCUMENTS

JP 2004-241679 8/2004
JP 2004-303993 10/2004
JP 2004-303994 10/2004

OTHER PUBLICATIONS

USPTO, (Lee) Final Rejection, May 16, 2011, in parent U.S. Appl. No. 11/293,893 [pending].
USPTO, (Lee) Non-Final Rejection, Nov. 5, 2010, in parent U.S. Appl. No. 11/293,893 [pending].
USPTO, (Lee) Final Rejection, Jun. 7, 2010, in parent U.S. Appl. No. 11/293,893 [pending].
USPTO, (Lee) Non-Final Rejection, Oct. 16, 2009, in parent U.S. Appl. No. 11/293,893 [pending].
USPTO, (Lee) Final Rejection, Feb. 9, 2009, in parent U.S. Appl. No. 11/293,893 [pending].
USPTO, (Lee) Non-Final Rejection, Jul. 3, 2008, in parent U.S. Appl. No. 11/293,893 [pending].
USPTO, (Lee) Office Communication, May 15, 2008, in parent U.S. Appl. No. 11/293,893 [pending].
USPTO, (Lee) Restriction Requirement, Mar. 26, 2008, in parent U.S. Appl. No. 11/293,893 [pending].
USPTO, (Song) "U.S. Appl. No. 13/355,540 (related)," [CTNF] Non-Final Rejection issued on Sep. 26, 2013.
USPTO, (Lee) "U.S. Appl. No. 13/355,540 (related)," [NOA] Notice of Allowance and Fees Due issued on Jan. 21, 2014.
USPTO, (Lee) Restriction Requirement, Jul. 17, 2013, in related U.S. Appl. No. 13/355,540 [pending].

\* cited by examiner

CROSS-SECTIONAL SEM PICTURE IN CHIP
(NO OXIDATION OF W IN CHIP)

CROSS-SECTIONAL SEM PICTURE OF
POSITIONING MARK IN PERIPHERY
(W IS OXIDIZED)

FIG. 15A
FIG. 15B
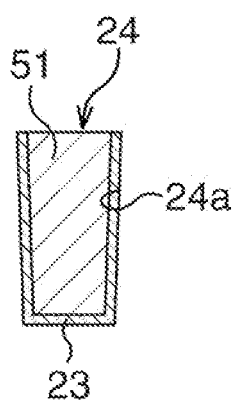
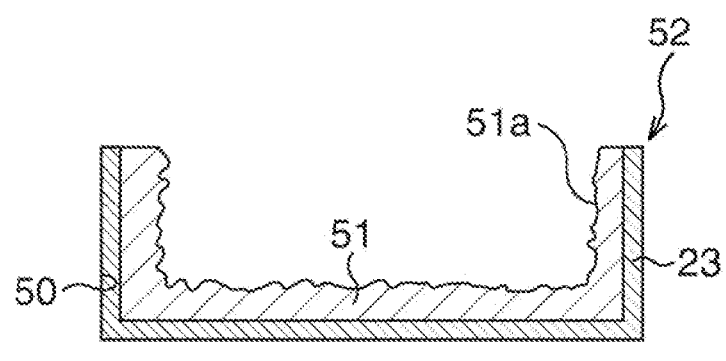
FIG. 16
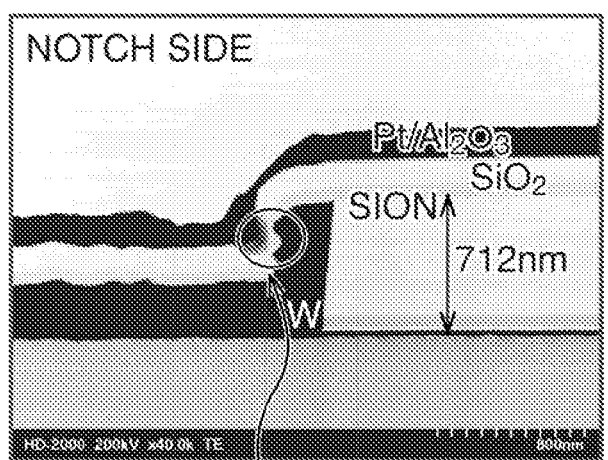
CONVEX AND CONCAVE OF W SURFACE ARE LARGE TO GIVE POOR COVERAGE OF SION

SEMICONDUCTOR DEVICE AND FABRICATING METHOD OF THE SAME

CROSS-REFERENCE TO RELATED APPLICATIONS

This application is a continuation of application Ser. No. 11/293,893, filed Dec. 5, 2005, which is a continuation-in-part application of application 11/093,242, filed Mar. 30, 2005.

This application is based upon and claims the benefit of priority from the prior Japanese Patent Application Nos. 2004-351905, filed on Dec. 3, 2004 and 2005-272595, filed on Sep. 20, 2005 the entire contents of which are incorporated herein by reference.

BACKGROUND OF THE INVENTION

1. Field of the Invention

The present invention relates to a semiconductor device including a capacitor construction consisting of a lower electrode, an upper electrode and a dielectric film interposed therebetween and a fabricating method of such a semiconductor device.

2. Description of the Related Art

Conventionally, there are known flash memories and ferroelectric random access memories (FeRAMs) as nonvolatile memories which do not erase stored information even when the power supply is turned off.

A flash memory includes a floating gate embedded in the gate insulating film of an insulated gate field effect transistor (IGFET) and stores information by accumulating, at the floating gate, electric charge indicative of information to be stored. In order to write and erase information, it is necessary to pass tunnel currents through the insulating film, thus requiring relatively high voltages.

An FeRAM stores information utilizing the hysteresis characteristic of a ferroelectric. A ferroelectric capacitor construction including a ferroelectric film interposed between a pair of electrodes induces polarization according to the voltage applied between the electrodes and also has spontaneous polarization even when the applied voltage is removed. When the polarity of the applied voltage is reversed, the polarity of spontaneous polarization is also reversed. By detecting the spontaneous polarization, information can be read out therefrom. An FeRAM can operate with a lower voltage as compared with a flash memory, thereby having an advantage of being capable of rapidly writing with low electric power. There have been studied SOCs (System On Chip) utilizing such FeRAMs in combination with conventional logic techniques, for applications such as IC cards.

[Patent Document 1] Japanese Patent Application Laid-open No. 2004-303993

[Patent Document 2] Japanese Patent Application Laid-open No. Hei 10-12617

An FeRAM is configured to have a plurality of intricately-laminated layers including transistor constructions and a first insulating film covering them, capacitor constructions and a protective film covering them for suppressing degradations in the characteristics of the capacitor constructions, a second insulating film, additionally multi-layer wirings thereon and an insulating film covering them, etc. Therefore, it is difficult to form connecting holes for establishing electric contact with lower layers to be desired shapes. For example, there is such problem that connecting holes are formed to be shapes having narrowed bottom portions, thus preventing the establishment of reliable electric connections.

Therefore, Patent Document 1 discloses an FeRAM configuration which is fabricated by previously forming openings in a protective film directly covering capacitor constructions for suppressing degradations in the characteristics thereof at the portions corresponding to the portions of connecting holes, and forming respective layers thereon, thus requiring no etching of the protective film when forming the connecting holes extending to the source/drain.

However, when the technique of Patent Document 1 is employed, openings are formed in the protective film provided for suppressing degradations in the characteristics, which will necessarily degrade the blocking function of the protective film against hydrogen or process damages, making it difficult to sufficiently suppress degradations in the characteristics of the capacitor constructions.

SUMMARY OF THE INVENTION

The present invention was made in view of the aforementioned problems and aims at providing a reliable semiconductor device and a fabricating method by sufficiently suppressing degradations of the characteristics of capacitor constructions and reducing poor contacts to improve the yield, while ensuring connections of electrically-connecting plugs.

A semiconductor device according to the present invention includes a semiconductor substrate, a first insulating film including at least a first interlayer insulating film formed on the semiconductor substrate, a first plug including a conductive material which fills a first connecting hole formed in the first insulating film, a capacitor construction including a lower electrode, an upper electrode and a dielectric film therebetween, a second insulating film including at least a laminated-layer construction consisting of a first protective film and a second protective film for preventing degradations of the characteristics of the capacitor construction, the first protective film and the second protective film being laminated with a second interlayer insulating film interposed therebetween and the second insulating film being formed to cover the capacitor construction, and a second plug including a conductive material which fills a second connecting hole, the second connecting hole being formed in the second insulating film such that the first plug is exposed at least at a portion thereof, wherein the first protective film is removed at least at the portion which corresponds to the second connecting hole and is in non-contact with the second plug and the first protective film is formed to cover at least the capacitor construction.

Preferably, the second protective film is formed to be in contact with the second plug.

A semiconductor device according to the present invention includes a semiconductor substrate; a construction which is pattern-formed above the semiconductor substrate; an insulating film comprising at least a laminated-layer construction consisting of a first protective film and a second protective film for preventing degradations of the characteristics of the construction, the first protective film and the second protective film being laminated with an interlayer insulating film interposed therebetween and, the insulating film being formed to cover said construction; and a plug including a conductive material which fills a connecting hole formed in the insulating film; wherein the first protective film is removed at least at the portion which corresponds to the connecting hole and is in non-contact with the plug and the first protective film is formed to cover at least the construction.

Preferably, the second protective film is formed to be in contact with the second plug.

A fabricating method of a semiconductor device according to the present invention includes the steps of: forming a first insulating film including at least a first interlayer insulating film on a semiconductor substrate; forming a first connecting hole in the first insulating film and forming a first plug including a conductive material which fills the first connecting hole; forming a capacitor construction including a lower electrode, an upper electrode and a dielectric film interposed therebetween; forming a second insulating film including at least a laminated-layer construction consisting of a first protective film and a second protective film for preventing degradations of the characteristics of the capacitor construction, the first protective film and the second protective film being laminated with a second interlayer insulating film interposed therebetween and, the second insulating film covering the capacitor construction; and forming a second connecting hole in the second insulating film such that the first plug is exposed at least at a portion thereof and forming a second plug including a conductive material which fills the second connecting hole; wherein after forming the first protective film and prior to forming the second interlayer insulating film, the first protective film is processed such that the first protective film is removed at least at the portion which corresponds to the second connecting hole and the first protective film is left to cover the capacitor construction.

Preferably, the process which is applied to the first protective film is not applied to the second protective film and the process is applied only to the first protective film.

A fabricating method of a semiconductor device according to the present invention includes the steps of: pattern-forming a construction above a semiconductor substrate; forming an insulating film including at least a laminated-layer construction consisting of a first protective film and a second protective film for preventing degradations of the characteristics of the construction so as to cover the construction, the first protective film and the second protective film being laminated with an interlayer insulating film interposed therebetween; and forming a connecting hole in the insulating film and forming a plug including a conductive material which fills the connecting hole; wherein after forming the first protective film and prior to forming the second interlayer insulating film, the first protective film is processed such that the first protective film is removed at least at the portion which corresponds to the second connecting hole and the first protective film is left to cover at least the construction.

Preferably, the process which is applied to the first protective film is not applied to the second protective film and the process is applied only to the first protective film.

BRIEF DESCRIPTION OF THE DRAWINGS

FIGS. 15A and 15B are schematic views for describing problems solved by the second embodiment.

FIG. 16 is a SEM picture for describing problems solved by the second embodiment.

DETAILED DESCRIPTION OF THE PREFERRED EMBODIMENTS

Figure 1A:
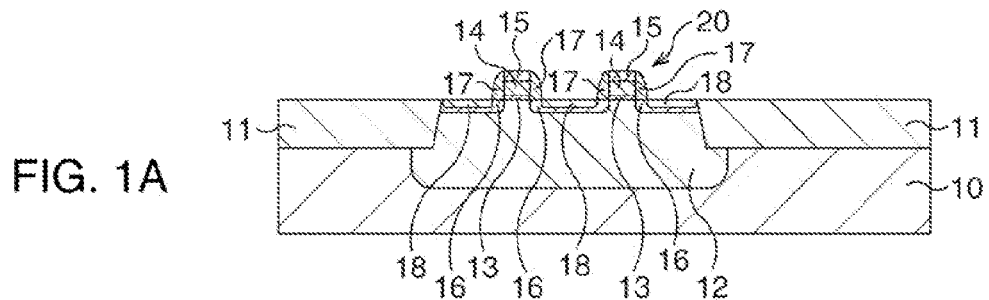
FIGS. 1A to 1E are schematic cross sectional views illustrating the fabricating method of a ferroelectric memory according to the first embodiment, in the order of the processes.

—The Basic Construction of the Present Invention—

In a semiconductor device such as an FeRAM including a construction such as a capacitor construction which is prone to degradations in the characteristics during processes (particularly, annealing processes) after the formation thereof, it is effective to form a protective film covering the construction in order to prevent degradations in the characteristics. However, a multi-layer film including such a protective film is difficult to etch away as required. In order to address the problem, the manner of Patent Document 1 is effective simply in view of the easiness of etching. This manner, however, may be a technique that sacrifices the suppression of degradations of the capacitor construction to some degree and provides the easiness of etching, in exchange for the sacrifice.

In view of the fact that the suppression of degradations of the capacitor constructions is extremely important for FeRAMs, the present inventor has earnestly conducted studies in order to provide the easiness of etching while sufficiently maintaining the suppression of degradations of capacitor constructions and, conclusively, reached a configuration including two protective films for suppressing degradations in the characteristics and an interlayer insulating film interposed therebetween, wherein a process for removing at least the regions of the lower protective film (first protective film) which lie at the regions where the connecting holes are to be formed is applied thereto, prior to the formation of connecting holes.

In this case, preferably, the aforementioned process to be applied to the first protective film is not applied to the upper protective film (second protective film) and this process is applied only to the first protective film. If there are gaps between the second protective film and plugs, this causes process damages or hydrogen to intrude into lower layers through the gaps during the subsequent processes, thus resulting in degradations in the characteristics of the capacitor constructions. Therefore, the aforementioned process is not applied to the second protective film when forming the plugs. In such a case, the second protective film and the plugs enclose the constructions thereunder, and there is no gap as aforementioned. Consequently, even though the aforementioned process is applied to the first protective film for providing the easiness of etching, the enclosed construction can suppress process damages or intrusion of hydrogen etc., thereby preventing degradations in the characteristics of the capacitor constructions.

In this case, in order to establish connection with, for example, transistor constructions, a so-called via-to-via construction is employed, instead of forming connection holes directly from wirings in an upper layer. In such a via-to-via construction, the formation of connecting holes is divided into two steps, wherein a first plug is formed and then a second plug is formed to be connected to the first plug. This can reduce the number of layers to be etched at once, which can increase the etching margin, thus enabling further certainly preventing degradations in the characteristics of the capacitor constructions.

Furthermore, when two protective films for suppressing degradations in the characteristics are formed as in the present invention, it may be possible to process the first protective film such that the first protective film is shaped into island shapes covering only the capacitor constructions, after the formation of the first protective film and prior to the formation of the second interlayer insulating film, as an aspect of the etching of the first protective film. This construction enables easily and certainly forming plugs without being concerned about the occurrence of etching of the first protective film due to positional displacements when forming connecting holes, since the first protective film is collectively removed around the portions at which the connecting holes are to be formed. Furthermore, since the capacitor constructions are covered with the first protective film in this case, there can be provided at least a minimum function of suppressing degradations in the characteristics of the capacitor constructions. Further, in cooperation with the second protective film provided above, suppressing degradations in the characteristics is sufficiently assured by the protective film as a whole.

Preferably, a lower-layer protective film for the capacitor constructions is formed prior to forming the capacitor constructions. This lower-layer protective film and the second protective film can, so to say, completely enclose the capacitor constructions, thus further ensuring the suppression of degradations in the capacitor characteristics. The lower-layer protective film also functions as an antioxidation film for layers below the capacitor constructions, for example, the first plugs in the via-to-via construction.

There are three possible aspects of the process for the first protective film.

(1) Only the regions of the first protective film which lie over the connecting holes (the connecting holes of first plugs, in the case of a via-to-via construction, hereinafter the same.) are removed such that the diameter becomes greater than the hole diameter of the connecting holes to form openings.

(2) the first protective film is processed such that it has island shapes covering only the capacitor constructions.

(3) the first protective film is processed such that it has remaining island shapes covering only the capacitor constructions and has, at its end portions adjacent to the regions lying over the connecting hole (the connecting holes of the first plugs, in the case of a via-to-via construction, hereinafter the same), cutouts surrounding portions of the peripheral surfaces of the regions adjacent to the end portions.

With the aspect (1), in comparison with the case of not etching the first protective film, it is possible to significantly increase the etching margin for the connecting holes (the connecting holes of the second plugs, in the case of a via-to-via construction, hereinafter the same) and reduce the contact resistances of the plugs, thus enabling formation of the plugs with high stability. However, this aspect has a tendency to cause positional deviations of openings, at regions including connecting holes with high densities, during the patterning of the first protective film, which may cause overlaps between adjacent openings. Accordingly, the aspect (1) is suitable for regions having not-significantly high densities of connecting holes.

With the aspect (2), in comparison with the case of not etching the first protective film, it is possible to significantly increase the etching margin for contact holes and reduce the contact resistance of plugs, thus enabling forming the plugs with high stability. The first protective film is formed in order to suppress the degradation of the capacitor constructions during processes and, therefore, the first protective film is unnecessary in the logic-circuit regions other than the memory cells. With the aspect (2), it is possible to leave the first protective film only at the memory-cell regions. Furthermore, since the first protective film is collectively removed around the regions where the connecting holes are to be formed, it is possible to easily and certainly form the plugs, without being concerned about etching of the first protective film due to positional deviations during the formation of the connecting holes. In this case, the first protective film covers the capacitor constructions, thereby playing at least a required role in suppressing the degradation of characteristics of the capacitor constructions. Further, with the first protective film in cooperation with the upper second protective film, namely with the entirety of the first and second protective films, it is possible to sufficiently offer the effect of suppressing characteristics degradation.

However, in the case where an end portion of the first protective film is spaced apart by a small distance from the connecting holes adjacent to the end portion due to the condition of positioning reference used in the processing of the first protective film, it may become difficult to apply an etching process to the first protective film such that it completely covers the capacitor constructions but does not overlap with the connecting holes. However, even in consideration of the aforementioned difficulties, in the case where significant positioning accuracy is not required, the first protective film can be formed such that it completely covers the capacitor constructions but does not overlap with the connecting holes. Thus, the aspect (2) is a method usable for offering excellent advantages as aforementioned.

With the aspect (3), it is possible to overcome the aforementioned drawbacks of the aspects (1) and (2) and utilize only their advantages. Namely, basically, as an aspect of processing the first protective film, similarly to the aspect (2), the first protective film is formed to be island shapes covering only the capacitor constructions, which can significantly increase the etching margin for the connecting holes and can reduce the contact resistance of the plugs, thereby enabling formation of plugs with high stability. Furthermore, it is possible to leave the first protective film only at the memory-cell regions where the first protective film is required for suppressing the degradation of the capacitor constructions due to processes while not leaving the first protective film at the logic-circuit regions where it is unnecessary. Further, the first protective film is collectively removed around the region where the connecting holes are to be formed, which enables easily and certainly forming the plugs, without being concerned about etching of the first protective film due to positional deviations during the formation of the connecting holes. In this case, the first protective film covers the capacitor constructions, thereby playing at least a required role in suppressing the characteristics degradation of the capacitor constructions. Further, with the first protective film in cooperation with the upper second protective films, namely with the entirety of the first and second protective films, it is possible to sufficiently suppress the characteristics degradation.

Further, with the aspect (3), the first protective film is formed to be greater only enough for overlapping with the connecting holes (the first plugs in the case of a via-to-via construction, hereinafter the same) adjacent to the end portion of the first protective film and, in order to avoid the overlaps, cutouts are formed at the end portion of the first protective film such that they surround portions of the peripheral surfaces of the connecting holes adjacent to the end portion. Namely, it is possible to form the first protective film to be greater enough for sufficiently covering the capacitor configurations, by the amount of formed cutouts, thus enabling provision of a sufficient positioning margin during the processing of the first protective film. Accordingly, even when the end portion of the first protective film is spaced apart from the connecting holes adjacent to the end portions by an extremely small distance, it is possible to easily and certainly apply an etching process to the first protective film such that it has a shape which completely covers the capacitor constructions without overlapping with the connecting holes adjacent to the end portion of the first protective film.

—Concrete Embodiments to Which the Present Invention is Applied—

Hereinafter, there will be described the construction of a ferroelectric memory and the fabrication method thereof, as concrete embodiments to which the present invention is applied.

(First Embodiment)

FIGS. 1A to 4B are schematic cross sectional views illustrating the fabricating method of a ferroelectric memory according to the present embodiment, in the order of the processes.

At first, as illustrated in FIG. 1A, MOS transistors 20 which function as selection transistors are formed on a silicon semiconductor substrate 10.

More specifically, a device separation construction 11 is formed by a STI (Shallow Trench Isolation) process, for example, on the surface layer of the silicon semiconductor substrate 10 to define a device activation region.

Subsequently, an impurity is implanted into the device activation region to form a well 12. In this case, B is implanted into the device activation region by ion implantation with a dose amount of $3.0 \times 10^{13}/cm^2$ and an acceleration energy of 300 keV.

Then, a thin gate insulating film 13 with a thickness of about 3.0 nm is formed on the device activation region, for example, by thermal oxidation. Then, a polycrystalline silicon film with a thickness of about 180 nm and, for example, a silicon nitride film with a thickness of about 29 nm are deposited on the gate insulating film 13 by CVD processes. Then, the silicon nitride film, the polycrystalline silicon film and the gate insulating film 13 are processed by lithography and subsequent dry etching into an electrode shape to pattern-form gate electrodes 14 on the gate insulating film 13. At this time, concurrently, cap films 15 made of silicon nitride films are pattern-formed on the gate electrodes 14.

Subsequently, an impurity is implanted into the device activation region while the cap films 15 are utilized as masks to form so-called LLD regions 16. In this case, As is implanted into the device activation region by ion implantation, for example, with a dose amount of $5.0 \times 10^{14}/cm^2$ and an acceleration energy of 10 keV.

Next, a silicon oxide film, for example, is deposited on the entire surface by a CVD process. Then, so-called etching-back is applied to this silicon oxide film such that it is left only on the side surfaces of the gate electrodes 14 and the cap films 15 to form side-wall insulating films 17.

Subsequently, an impurity is implanted into the device activation region while the cap films 15 and the side-wall insulating films 17 are utilized as masks to form source/drain regions 18 overlaid on the LDD regions 16, under a condition which causes the impurity concentration thereof to be higher than that of the LDD regions 16. In this case, P is implanted into the device activation region by ion implantation with a dose amount of $5.0 \times 10^{14}/cm^2$ and an acceleration energy of 13 KeV. Thus, the formation of the MOS transistors 20 is completed.

Figure 1B:
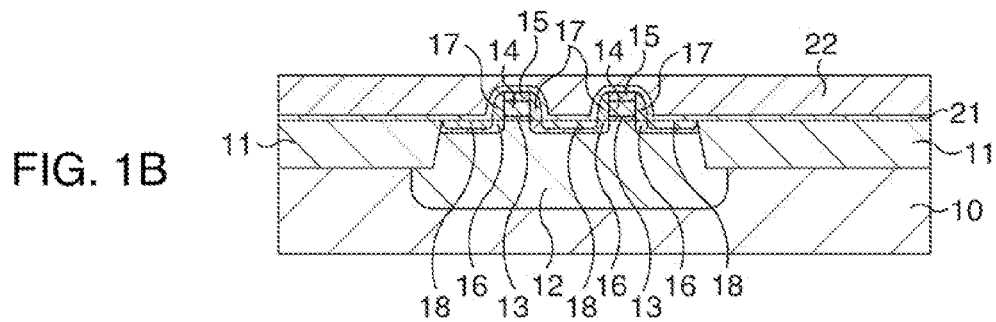

Subsequently, as illustrated in FIG. 1B, a protective film 21 and a first interlayer insulating film 22 for the MOS transistors 10 are formed.

More specifically, the protective film 21 and the first interlayer insulating film 22 are sequentially deposited such that they cover the MOS transistors 20. Here, as the protective film 21, a silicon oxide film with a thickness of about 20 nm is deposited by a CVD process. As the first interlayer insulating film 22, a plasma SiO film (with a thickness of about 20 nm), a plasma SiN film (with a thickness of about 80 nm) and a plasma TEOS film (with a thickness of about 1000 nm) are sequentially deposited to form a laminated-layer construction and, after the deposition thereof, the construction is polished by CMP to a thickness of about 700 nm.

Figure 1C:
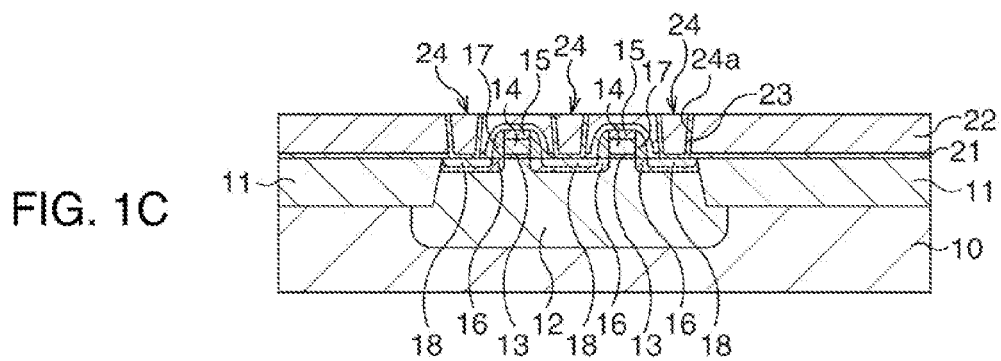

Then, as illustrated in FIG. 1C, first plugs 24 connected to the source/drain regions 18 are formed.

More specifically, via holes 24a with a diameter of, for example, about 0.25 μm are formed by processing the first interlayer insulating film 22 and the protective film 21 by lithography and subsequent dry etching until a portion of the surfaces of the source/drain regions 18 are exposed. Then, a Ti film (with a thickness of about 30 nm) and a TiN film (with a thickness of about 20 nm), for example, are deposited with sputtering processes such that they cover the wall surfaces of the via holes 24a to form a underlying film (glue film) 23. Then, a tungsten (W) film, for example, is formed by a CVD process such that it fills the via holes 24a through the glue film 23. Then, the W film and the glue film 23 are polished with CMP using the first interlayer insulating film 22 as the stopper to form first plugs 24 consisting of the via holes 24a and W embedded therein through the glue films 23.

Figure 1D:
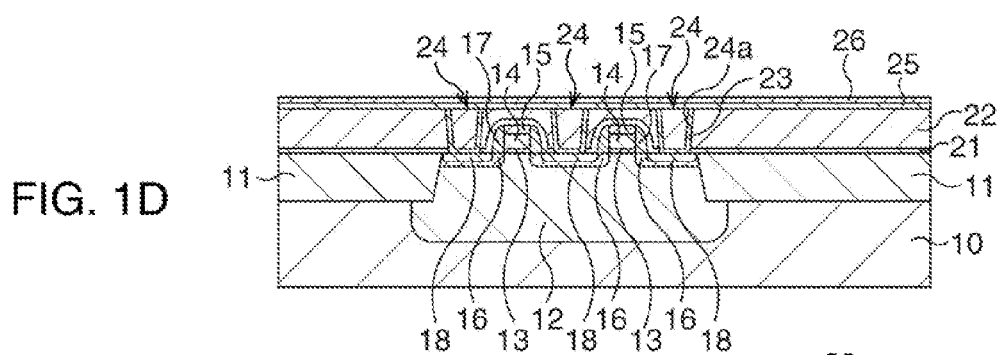

Then, as illustrated in FIG. 1D, a lower-layer protective film 25 and an orientation improving film 26 for a lower electrode of ferroelectric capacitor constructions 30 which will be described later are formed.

More specifically, the antioxidation film 25 is formed in order to prevent the oxidation of the first plugs 24 caused by thermal annealing in an oxygen atmosphere during the formation of the ferroelectric capacitor constructions. The antioxidation film 25 is formed to be, for example, a laminated-layer construction consisting of, for example, SiON (with a thickness of about 130 nm) and plasma TEOS (with a thickness of about 130 nm). The orientation improving film 26 is, for example, a silicon oxide film. The lower-layer protection film also functions as an antioxidation film for the first plugs 24.

Figure 1E:
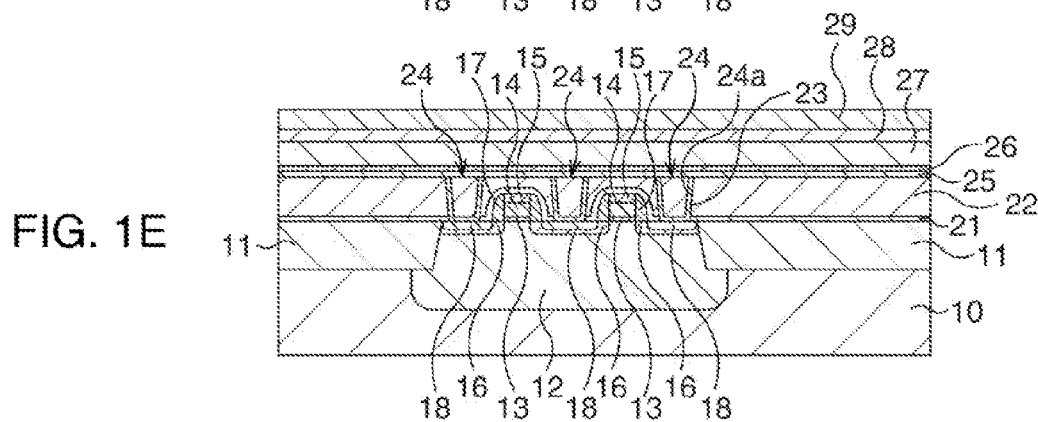

Subsequently, as illustrated in FIG. 1E, a lower electrode layer 27, a ferroelectric film 28 and an upper electrode layer 29 are sequentially formed.

More specifically, at first, a Ti film with a thickness of about 20 nm and a Pt film with a thickness of about 150 nm, for example, are sequentially deposited by sputtering processes to form a lower electrode layer 27 having a laminated-layer construction consisting of a Ti film and a Pt film. Then, by an RF sputtering process, a ferroelectric film 28 with a thickness of about 200 nm made of, for example, PZT which is a ferroelectric is deposited on the lower electrode layer 27. Then, an RTA process is applied to the ferroelectric film 28 to crystallize the ferroelectric film 28. Subsequently, by a reactive sputtering process, an upper electrode layer 29 with a thickness of about 200 nm made of, for example, $IrO_2$ which is a conductive oxide is deposited on the ferroelectric film 28. Further, the material of the upper electrode layer 29 may be Ir, Ru, $RuO_2$, $SrRuO_3$, other conductive oxides or laminated-layer construction consisting thereof, instead of $IrO_2$.

Figure 2A:
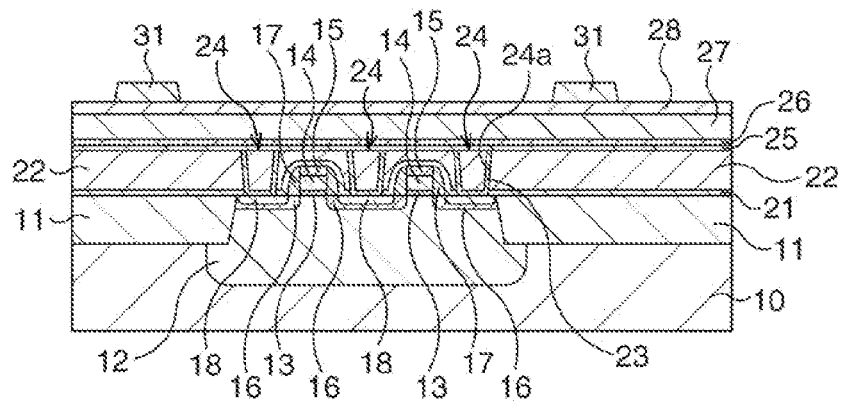
FIGS. 2A to 2D are schematic cross sectional views illustrating the fabricating method of a ferroelectric memory according to the first embodiment, in the order of the processes, subsequently to FIG. 1E.

Then, as illustrated in FIG. 2A, upper electrodes 31 are pattern-formed.

More specifically, the upper electrode layer 29 is processed into a plurality of electrodes by lithography and subsequent dry etching to pattern-form a plurality of upper electrodes 31.

Figure 2B:
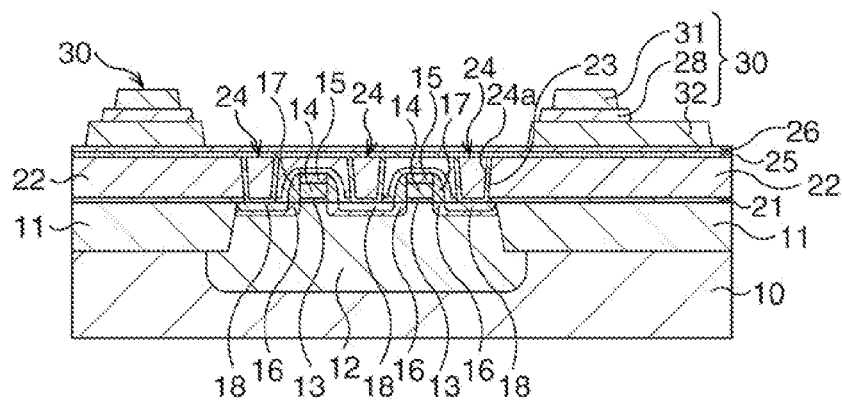

Subsequently, as illustrated in FIG. 2B, the ferroelectric film 28 and the lower electrode layer 27 are processed to form ferroelectric capacitor constructions 30.

More specifically, at first, the ferroelectric film 28 is processed by lithography and subsequent dry etching such that it is aligned with the upper electrodes 31 and is sized to be slightly greater than the upper electrodes 29.

Next, lower electrodes 32 are pattern-formed by processing the lower electrode layer 27 by lithography and subsequent dry etching such that it is aligned with the processed ferroelectric film 28 and is sized to be slightly greater than the ferroelectric film. Thus, the formation of the ferroelectric capacitor constructions 30 has been completed, wherein the ferroelectric film 28 and the upper electrode 31 have been sequentially laminated on the lower electrode 32 and the lower electrode 32 and the upper electrode 31 have been capacitively coupled to each other through the ferroelectric film 28.

Figure 2C:
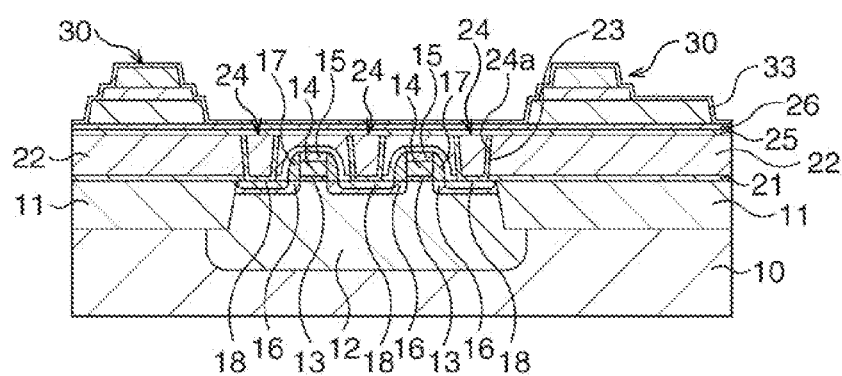

Then, as illustrated in FIG. 2C, a first protective film 33 for preventing the degradation in the characteristics of the ferroelectric capacitor constructions 30 is formed.

More specifically, the first protective film 33 is formed such that it directly covers the ferroelectric capacitor constructions 30. The first protective film 33 is for alleviating damages of the ferroelectric capacitor constructions 30 which would be otherwise caused by the multi-layer processing after the formation of the ferroelectric capacitor constructions 30 and is formed from, for example, alumina to be a thickness of about 20 nm by a sputtering process.

Figure 2D:
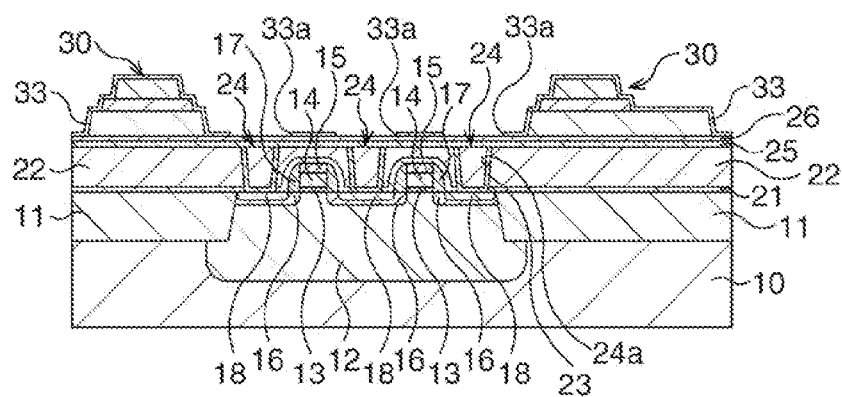

Subsequently, as illustrated in FIG. 2D, the first protective film 33 is processed.

More specifically, openings 33a with a hole diameter greater than that of the via holes 24a are formed by lithography and subsequent dry etching at the portions of the first protective film 33 which correspond to the connecting holes 39a of second plugs 39 which will be described later, namely at the portions thereof which align with the first plugs 24, wherein the openings 33 have a diameter greater than that of the connecting holes 39a by about 0.4 µm. In the present embodiment, in order to prevent the first protective film 33 from existing at the regions of the via holes 39a during the formation of the via holes 39a which will be described later, the regions of the first protective film 33 are removed in advance. By forming the openings 33a with a hole diameter greater than that of the via holes 24a using the via holes 24a as the reference as described above, it is possible to perform etching without being affected by the first protective film 33 during the formation of the via holes 39a.

Figure 5:
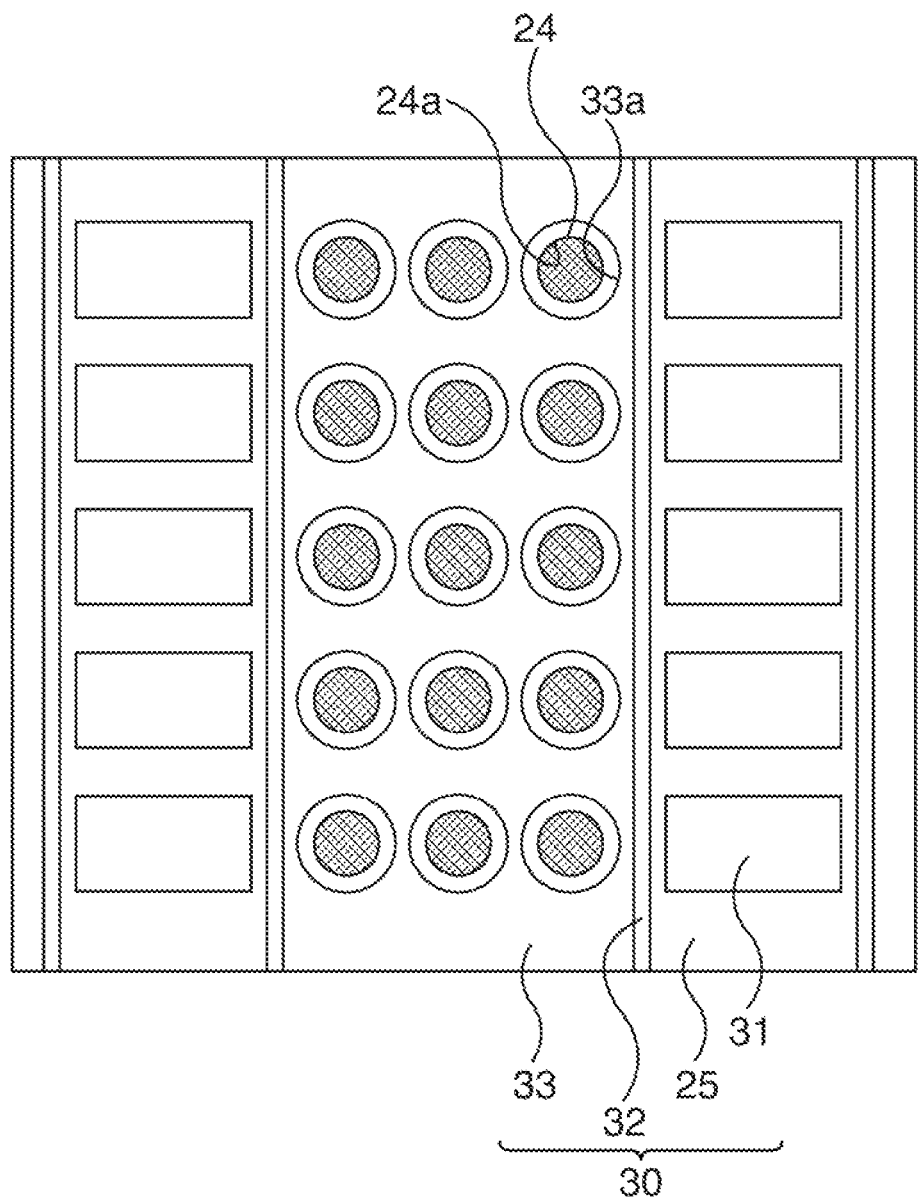
FIG. 5 is a schematic plan view illustrating, from above, the first protective film having openings formed therethrough.

FIG. 5 is a plan view illustrating, from above, the first protective film 33 having the openings 33a formed therein. For patterning the first protective film 33, a reticle mask is used, wherein the reticle mask has a reticle pattern with a predetermined diameter greater than that of a reticle pattern used for patterning for the via holes 24a at the regions aligning with the via holes 24a of the first plugs 24. In the present embodiment, in order to prevent the first protective film 33 from existing at the regions of the second via holes 39a during the formation of the second via holes 39a, the regions of the first protective film 33 are removed in advance. Accordingly, with such patterning of the first protective film 33, it is possible to significantly increase the etching margin for the via holes 39a and reduce the contact resistance, thereby enabling forming the second plugs 39 which will be described later with high stability.

However, this tends to cause positional deviations during the formation of the via holes 39a at regions where the via holes 39a are formed with high densities, which may result in overlaps of adjacent via holes 39a. Accordingly, the aforementioned patterning of the first protective film 33 is suitable for regions including via holes 39a with not-significantly high densities.

Then, an annealing process is performed in order to repair damages of the ferroelectric capacitor constructions 30 caused by the respective processes during and after the formation of the ferroelectric capacitor constructions 30. Here, the annealing process is performed at a temperature of 650° C. and in an oxygen atmosphere for 60 minutes.

Figure 3A:
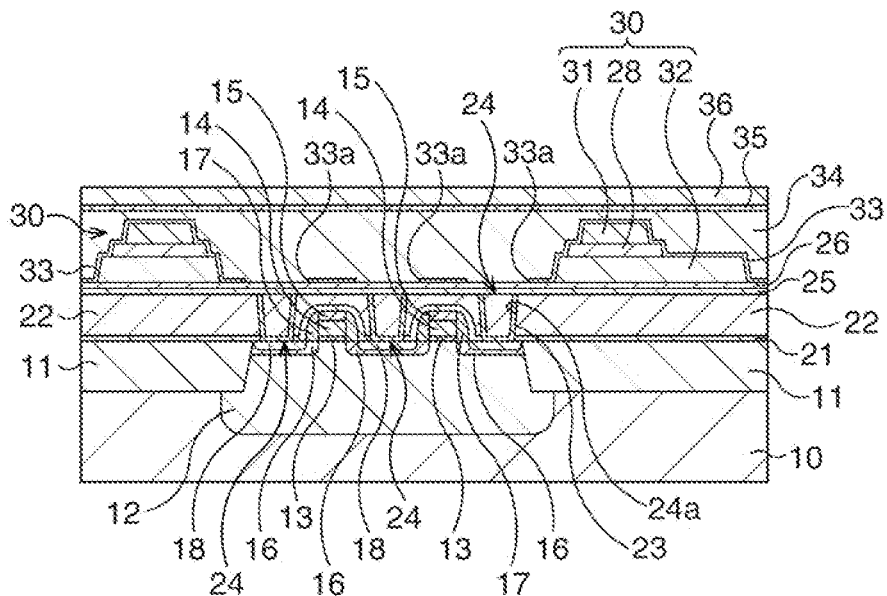
FIGS. 3A and 3B are schematic cross sectional views illustrating the fabricating method of a ferroelectric memory according to the first embodiment, in the order of the processes, subsequently to FIG. 2D.

Then, as illustrated in FIG. 3A, a second interlayer insulating film 34, a second protective film 35 and an oxide film 36 are formed.

More specifically, the second interlayer insulating film 34, the second protective film 35 and the oxide film 36 are sequentially laminated such that they cover the ferroelectric capacitor constructions 30 through the first protective film 33. The second interlayer insulating film 34 is formed, for example, by depositing a plasma TEOS film with a thickness of about 1400 nm and then polishing it by CMP to a thickness of about 1000 nm. After the CMP, for the sake of dewatering of the second interlayer insulating film 34, an N$_2$O plasma annealing process is applied thereto. The second protective film 35 is for preventing damages of the ferroelectric capacitor constructions 30 which would be otherwise caused by subsequent multi-layer processing and is formed from, for example, alumina to be a thickness of about 50 nm by a sputtering process. The oxide film 36 is formed, for example, by depositing a plasma TEOS film with a thickness of about 300 nm.

Figure 3B:
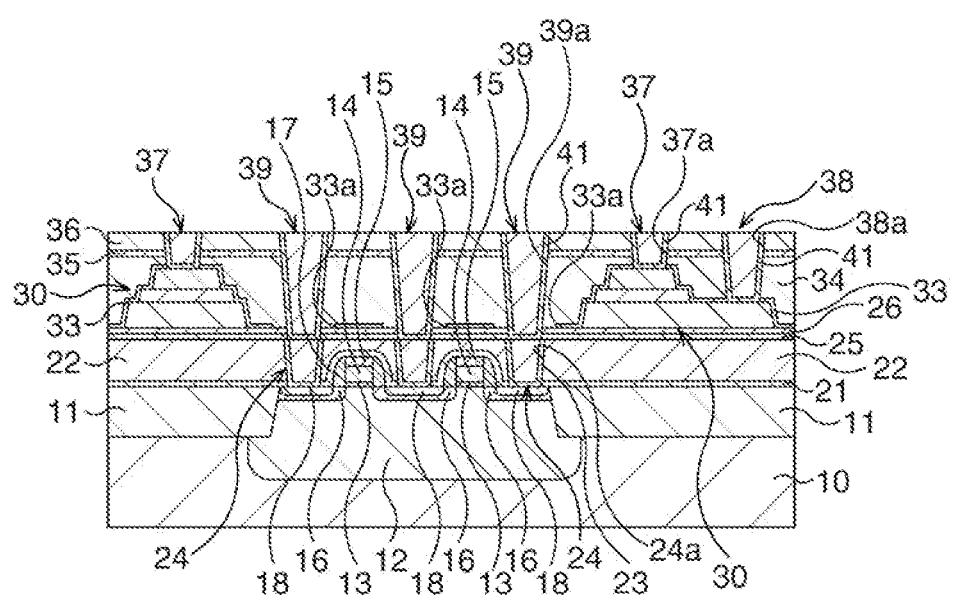

Then, as illustrated in FIG. 3B, plugs 37, 38 for the ferroelectric capacitor constructions 30 and the second plugs 39 connected to the first plugs 24 are formed.

At first, via holes 37a, 38a extending to the ferroelectric capacitor constructions 30 are formed.

More specifically, the oxide film 36, the second protective film 35, the second interlayer insulating film 34 and the first protective film 33 are processed by lithography and subsequent dry etching until a portion of the surfaces of the upper electrodes 31 is exposed, and concurrently the oxide film 36, the second protective film 35, the second interlayer insulating film 34 and the first protective film 33 are processed by lithography and subsequent dry etching until a portion of the surfaces of the lower electrodes 32 is exposed. Thus, via holes 37a, 38a with a diameter of about 0.5 µm, for example, are concurrently formed at the respective portions. During the formation of the via holes 37a, 38a, the upper electrodes 31 and the lower electrodes 32 respectively function as etching stoppers.

Then, an annealing process is performed in order to repair damages of the ferroelectric capacitor constructions 30 caused by the respective processes after the formation of the ferroelectric capacitor constructions 30. In this case, an annealing process is performed at a temperature of 500° C. in an oxygen atmosphere for 60 minutes.

Then, the via holes 39a extending to the first plugs 24 are formed.

More specifically, the via holes 39a with a diameter of, for example, about 0.3 µm are formed as follows. The oxide film 36, the second protective film 35, the second interlayer insulating film 34, the orientation improving film 26 and the antioxidation film 25 are processed by lithography and subsequent dry etching by utilizing the first plugs 24 as etching stoppers until a portion of the surfaces of the first plugs 24 is exposed. At this time, since there have been formed the openings 33a with a diameter greater than that of the via holes 39a at the portions of the first protective film 33 aligning with the first plugs 24, the via holes 39a are formed within the openings 33a without etching the first protective film 33.

Next, the plugs 37, 38 and the second plugs 39 are formed.

At first, an RF preparation for treating about a few tens nm, about 10 nm in this case, on the basis of etching of an ordinary oxide film, is performed. Then, a TiN film with a thickness of about 75 nm is deposited by a sputtering process to form an underlying film (glue film) 41 such that it covers the respective wall surfaces of the via holes 37a, 38a, 39a. Then, for example, a W film is formed by a CVD process such that the via holes 37a, 38a and 39a are filled with the W film through the glue film 41. Then, the W film and the glue film 41 are polished by CMP using the oxide film 36 as the stopper to form the plugs 37, 38 and the second plugs 24 constituted by the via holes 37a, 38a and 39a and the W embedded therein through the glue films 41. Since the second plugs 39 are formed in the via holes 39a provided within the openings 33a, the second plugs 39 are formed to be in non-contact with the first protective film 33 (with the perimeters of the openings 33a in the first protective film 33).

The first and second plugs 24, 39 are formed to be a via-to-via construction in which the both plugs are electrically connected to each other. This via-to-via construction may increase the etching margin in forming the via holes, thus easing the aspect ratio of the via holes. Furthermore, the first protective film 33 is not etched when forming the via holes 39a of the second plugs 39, wherein the first protective film 33 is the most difficult to etch, out of the oxide film 36, the second protective film 35, the second interlayer insulating film 34, the first protective film 33, the orientation improving film 26 and the antioxidation film 25. Consequently, the via holes 39a can be formed to be desired shapes according to the resist pattern without reducing their bottom portions, thereby ensuring the connections between the second plugs 39 and the first plugs 24.

Further, the second protective film 35 is not processed as the first protective film 33 and the via holes 39a are formed when the second protective film 35 has been formed on the entire surface of the second interlayer insulating film 34, and then the second plugs 39 are formed such that the via holes 39a are filled therewith. Therefore, the constructions under the second protective film 35 are enclosed by the second protective film 35, the plugs 37, 39 and the second plugs 39, which can cause oxygen or hydrogen generated in subsequent processes to be blocked by the second protective film 35, the plugs 37, 39 and the second plugs 39, thereby suppressing deleterious effects on the lower layers including the ferroelectric capacitor constructions 30 (including degradations in the characteristics of the ferroelectric capacitor constructions 30).

Figure 4A:
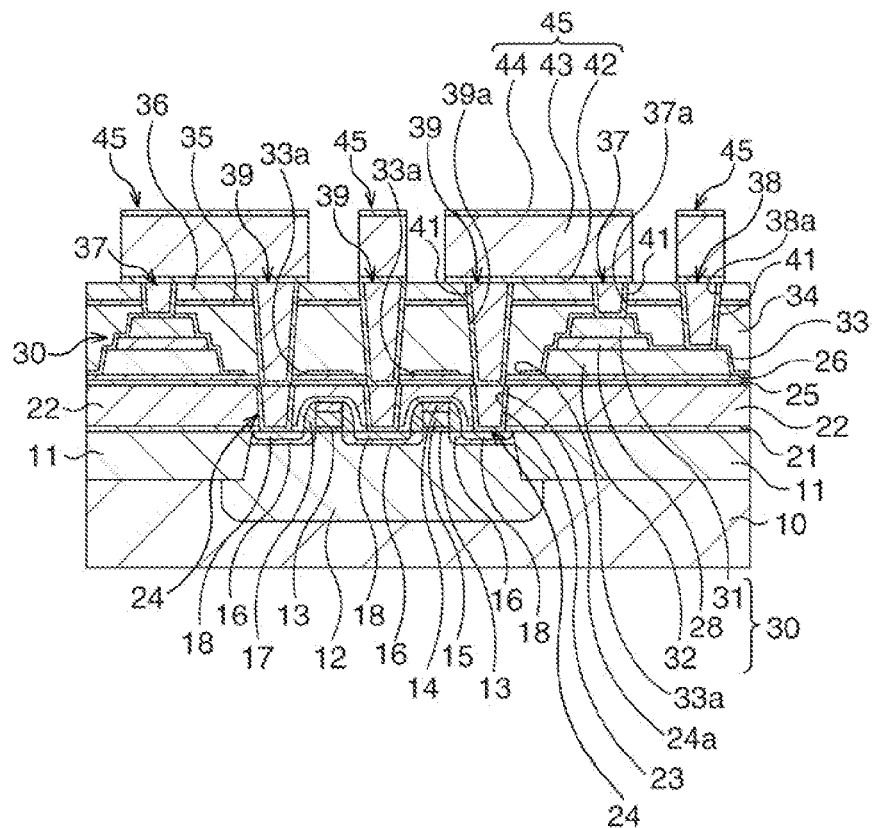
FIGS. 4A and 4B are schematic cross sectional views illustrating the fabricating method of a ferroelectric memory according to the first embodiment, in the order of the processes, subsequently to FIG. 3B.

Subsequently, as illustrated in FIG. 4A, wirings 45 connected to the plugs 37, 38 and the second plugs 39 are formed.

More specifically, at first, a barrier metal film 42, a wiring film 43 and a barrier metal film 44 are deposited on the entire surface by sputtering processes, etc. As the barrier metal film 42, a Ti film (with a thickness of about 60 nm) and a TiN film (with a thickness of about 30 nm) are sequentially formed by sputtering processes. As the wiring film 43, for example, an Al alloy film (an Al—Cu film, in this case) with a thickness of about 360 nm is formed. As the barrier metal film 44, a Ti film (with a thickness of about 5 nm) and a TiN film (with a thickness of about 70 nm) are sequentially formed by sputtering processes. At this time, the wiring film 43 has the same configuration as those of logic sections of the same rule other than FeRAMs, and there is no problem in terms of the wiring processes and the reliability.

Next, a SiON film (not shown), for example, is formed as an antireflection film. Then, by lithography and subsequent dry etching, the antireflection film, the barrier metal film 44, the wiring film 43 and the barrier metal film 42 are processed into wiring shapes to pattern-form the wirings 45. Further, instead of forming an Al alloy film as the wiring film 43, a Cu film (or a Cu alloy film) may be formed by a so-called damascene process and Cu wirings may be formed as the wirings 45.

Figure 4B:
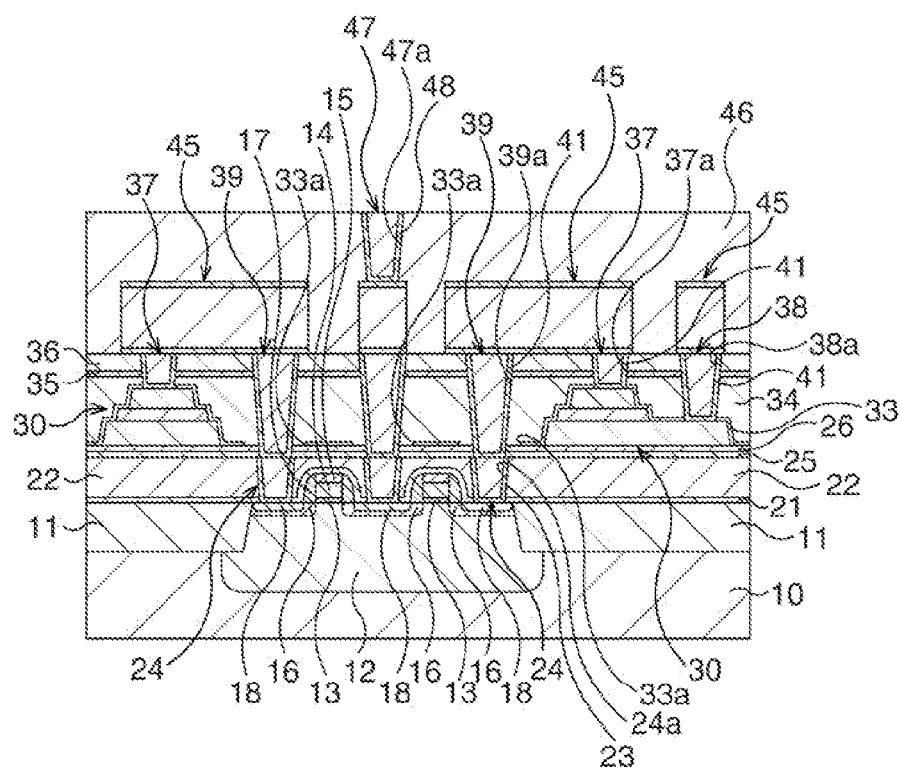

Then, as illustrated in FIG. 4B, a third interlayer insulating film 46, a third plug 47, and wirings thereon are formed to complete the formation of the FeRAM.

More specifically, at first, a third interlayer insulating film 46 is formed such that it covers the wirings 45. The third interlayer insulating film 46 is formed by forming a silicon oxide film with a thickness of about 700 nm, then forming a plasma TEOS thereon such that the total thickness is about 1100 nm and then polishing the surface thereof to a thickness of about 750 nm.

Next, a plug 47 connected to the wirings 45 is formed.

The third interlayer insulating film 46 is processed by lithography and subsequent dry etching until a portion of the surface of the wirings 45 is exposed to form a via hole 47a with a diameter of, for example, about 0.25 μm. Then, an underlying film (glue film) 48 is formed such that it covers the wall surfaces of the via hole 47a. Then, a W film is formed by a CVD process such that the via hole 47a is filled with the W film through the glue film 48. Then, the W film and the glue film 48, for example, are polished using the third interlayer insulating film 46 as the stopper to form the plug 47 constituted by the via hole 47a and the W embedded therein through the glue film 48.

Then, the processes for forming wirings as an upper layer, an interlayer insulating film and plugs are repeated to form a wiring construction (not shown) consisting of, for example, five layers including the wirings 45. Subsequently, a first cover film and a second cover film (not shown) are formed. In this case, an HDP-USG film with a thickness of about 720 nm is deposited as the first cover film, for example and a silicon nitride film with a thickness of about 500 nm is deposited as the second cover film, for example. Further, a contact for connecting to a pad is formed in the five-layer construction. Then, a polyimide film (not shown), for example, is formed and patterned to complete the formation of the FeRAM according to the present embodiment.

Figure 6:
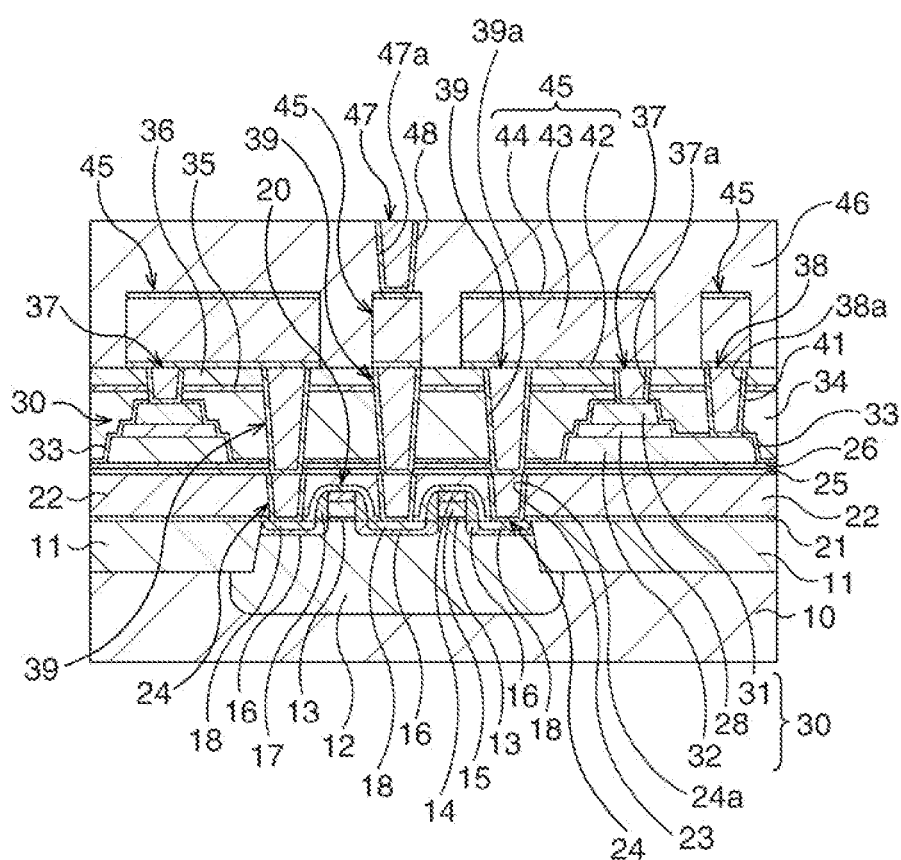
FIG. 6 is a schematic cross sectional view illustrating a ferroelectric memory according to the Comparative Embodiment for the present invention.

FIG. 6 illustrates a ferroelectric memory of Comparative Embodiment of the present invention. In FIG. 6, the same components as those in FIGS. 1 to 5 of the present embodiment are designated by the same reference characters.

The first protective layer 33 in this ferroelectric memory is not processed as in the present embodiment and, when forming the via holes 39a of the second plugs 39, it is necessary to etch the six layers including the first protective film 33, namely the oxide film 36, the second protective film 35, the second interlayer insulating film 34, the first protective film 33, the orientation improving film 26 and the antioxidation film 25. In this Comparative Embodiment, the via holes 39a can not be formed to be desired shapes as previously described and thus have narrowed bottom portions.

Figure 7A:
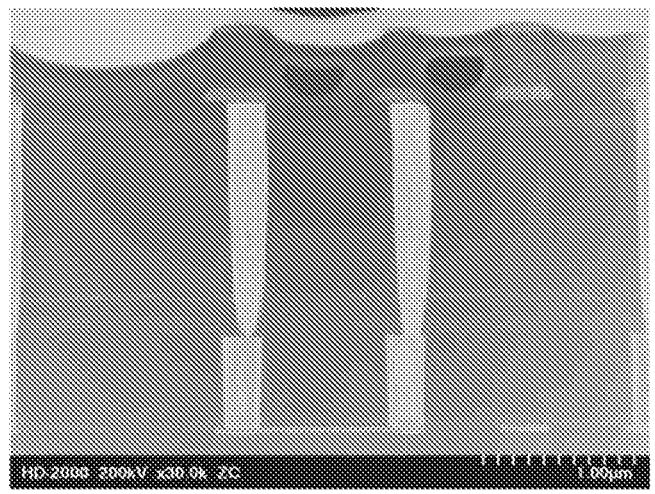
FIGS. 7A and 7B present SEM pictures of a via-to-via construction in the ferroelectric memory according to the Comparative Embodiment for the present invention.
Figure 7B:
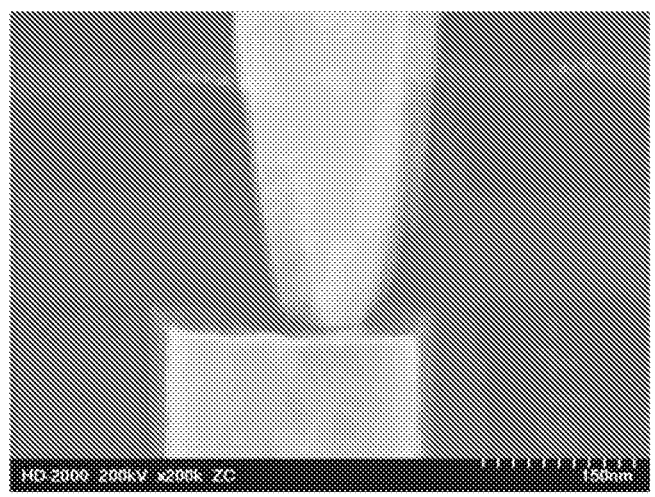

FIG. 7 present pictures of such states taken by a scanning electron microscope (SEM). FIG. 6A shows a via-to-via construction and FIG. 6B shows the connecting portion between a first plug 24 and a second plug 39, in an enlarged manner.

As can be clearly seen, there is not established sufficient connection between the first plug 24 and the second plug 39.

Figure 8:
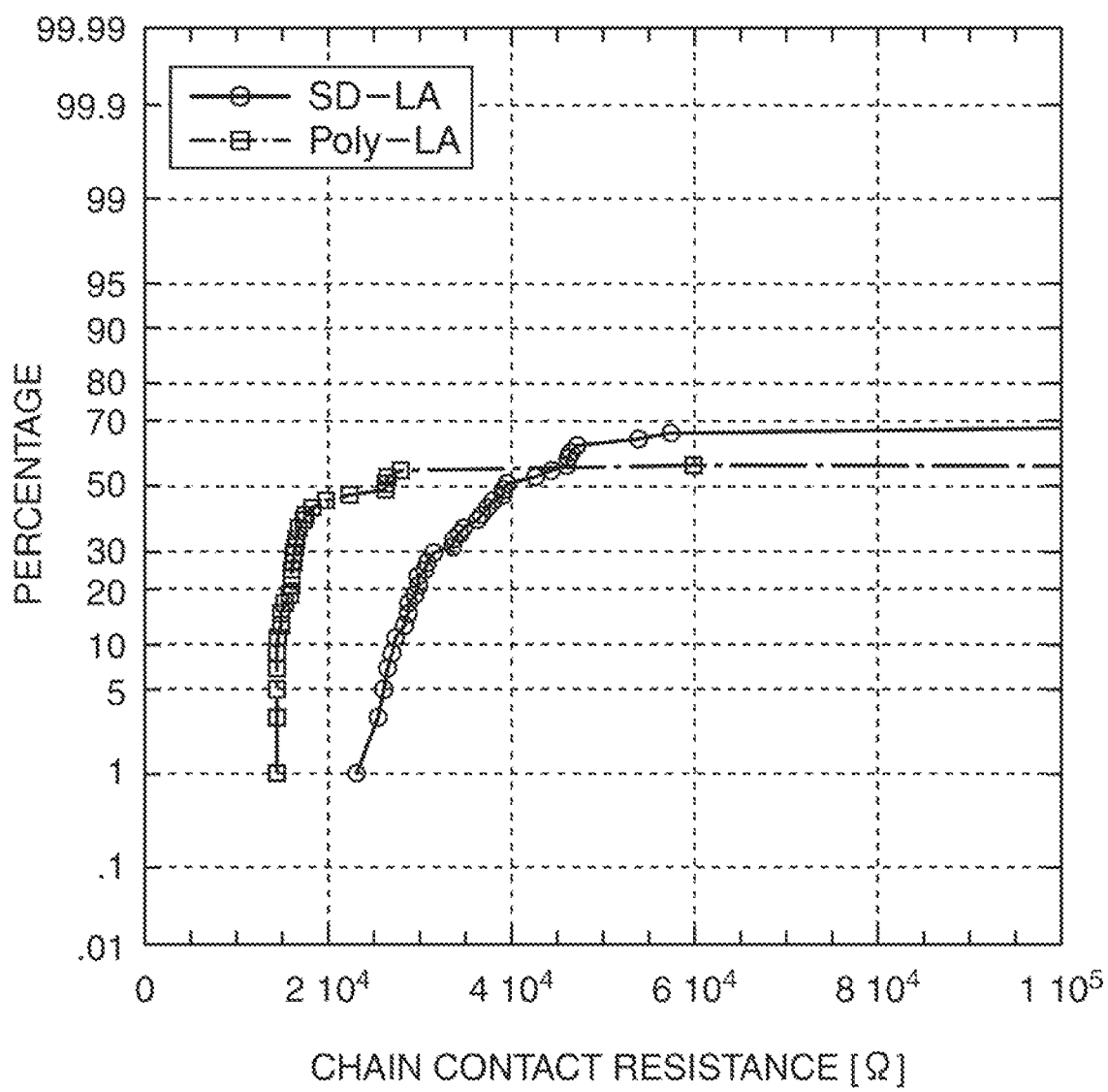
FIG. 8 is a characteristic view illustrating the result of determination of the chain contact resistance of the ferroelectric memory according to the Comparative Embodiment for the present invention.

FIG. 8 illustrates the result of determination of the chain contact resistance of the ferroelectric memory according to Comparative Embodiment. The horizontal axis represents the chain contact resistance (ohm) and the vertical axis represents the ratio (%) of plugs within the chip surface, respectively.

As can be seen, in the case of Comparative Embodiment, at a ratio slightly larger than 50%, the chain contact resistance value almost diverges, thus resulting in poor contact, which will be a main cause of low yields.

Figure 9:
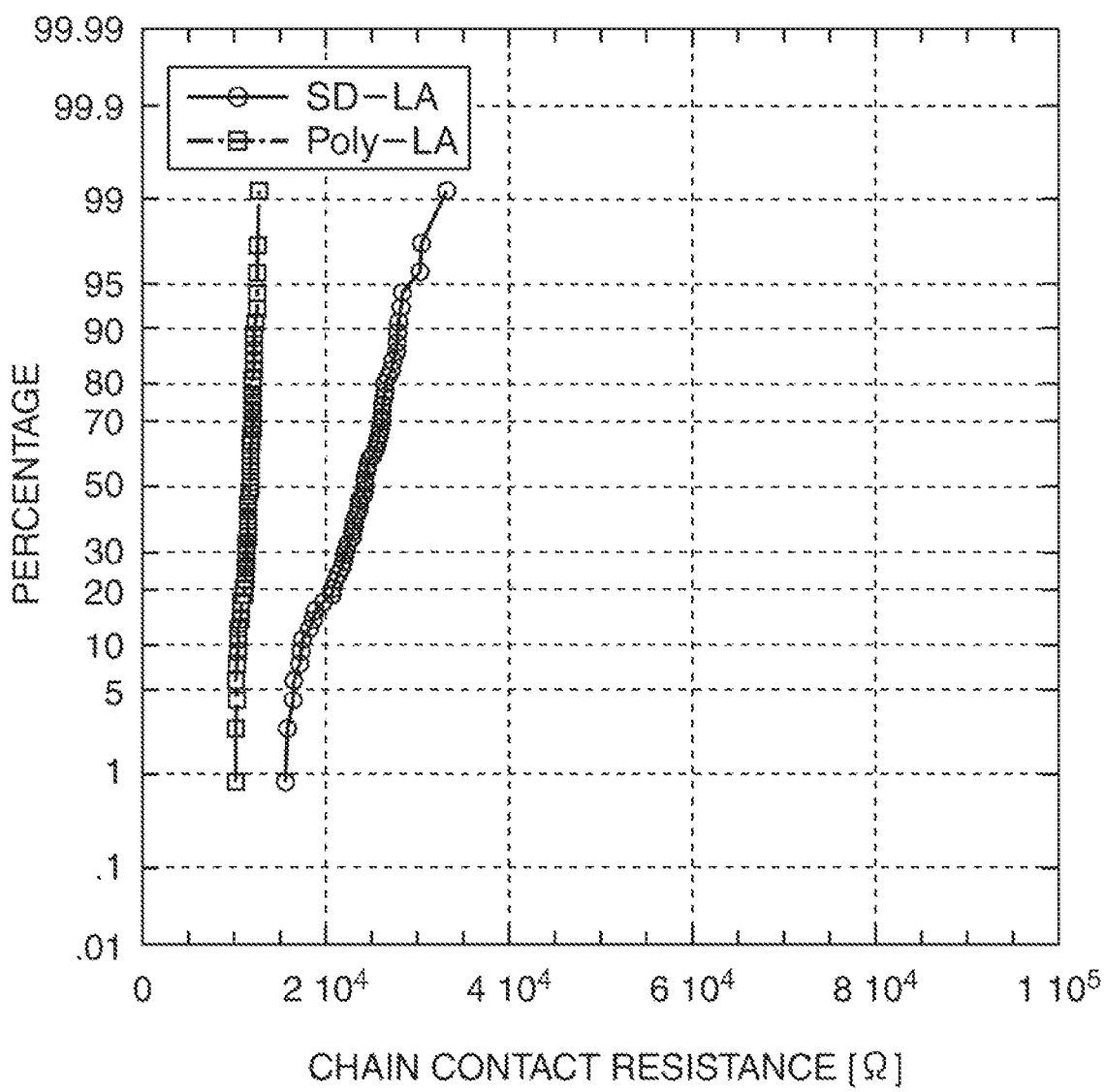
FIG. 9 is a characteristic view illustrating the result of determination of the chain contact resistance of the ferroelectric memory according to the present invention.

On the other hand, FIG. 9 illustrates the result of determination of the chain contact resistance of the ferroelectric memory according to the present embodiment. Similarly to in FIG. 7, the horizontal axis represents the chain contact resistance (ohm) and the vertical axis represents the ratio (%) of plugs within the chip surface, similarly to FIGS. 6A and 6B.

As can be seen, with the present embodiment, the resistance value can be maintained sufficiently stably low for ratios up to a value slightly greater than 99%, which indicates nonoccurrence of poor contact.

As described above, according to the present embodiment, the ferroelectric capacitor constructions 30 are covered with the first protective film 33, and there is formed thereon the second protective film 35 which encloses the constructions under the second protective film 35 in cooperation with the plugs 37, 38 and the second plug 39, thereby sufficiently preventing degradations in the characteristics of the ferroelectric capacitor constructions 30 while sufficiently ensuring the connection between the electrically-connecting plugs 24, 39 to prevent poor contact and improve the yield. Thus, it is possible to realize a ferroelectric memory with high reliability.

(Modified Embodiments)

Hereinafter, modified embodiments of the first embodiment will be described. In the present modified embodiment, there will be disclosed the construction and the fabricating method of a ferroelectric memory similarly to in the first embodiment. The present modified embodiment is different from the first embodiment in the processing condition for the first protective film 33.

(First Modified Embodiment)

FIG. 10 is a cross sectional view for describing main processes of the present modified embodiment which are particularly different from those of the first embodiment.

Figure 10A:
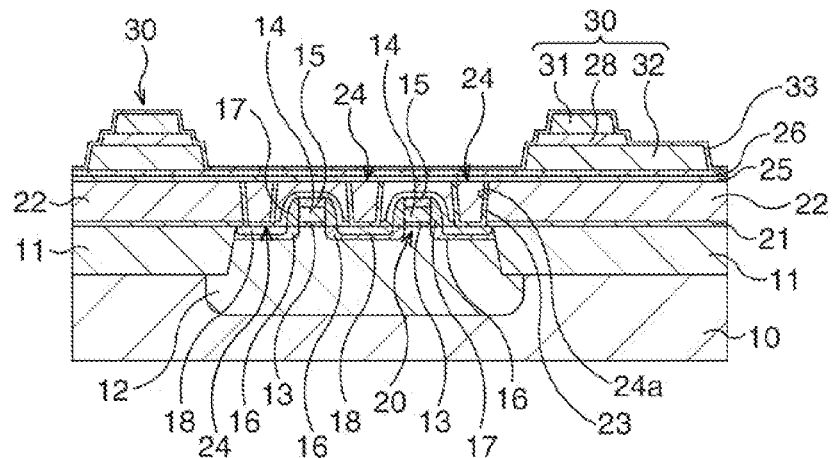
FIGS. 10A to 10C are schematic cross sectional views for describing main processes of a modified embodiment of the first embodiment which are particularly different from those of the first embodiment.

In the present modified embodiment, similarly to in the first embodiment, firstly transistor constructions 20, first plugs 24, ferroelectric capacitor constructions 30 and a first protective film 33 are formed and, after the formation of them, the state of FIG. 10A corresponding to FIG. 2C is reached.

Figure 10B:
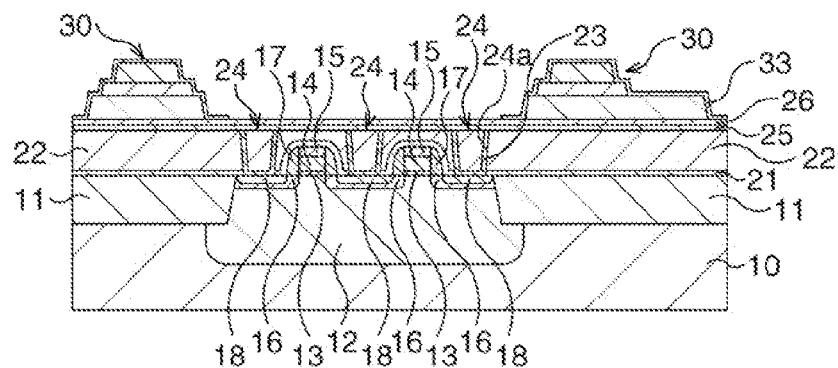

Subsequently, as illustrated in FIG. 10B, the first protective film 33 is processed.

More specifically, the first protective film 33 is processed by lithography and subsequent dry etching such that island-shaped portions of the first protective film 33 covering only the ferroelectric capacitor constructions 30 are left. At this time, the first protective film 33 is made to cover only the ferroelectric capacitor constructions 30 and the portions of the first protective film 33 lying over the first plugs 24 are collectively removed. For example, the first protective film 33 is patterned to have a width greater than the width of the lower electrodes 32 of the ferroelectric capacitor constructions 30.

Figure 11:
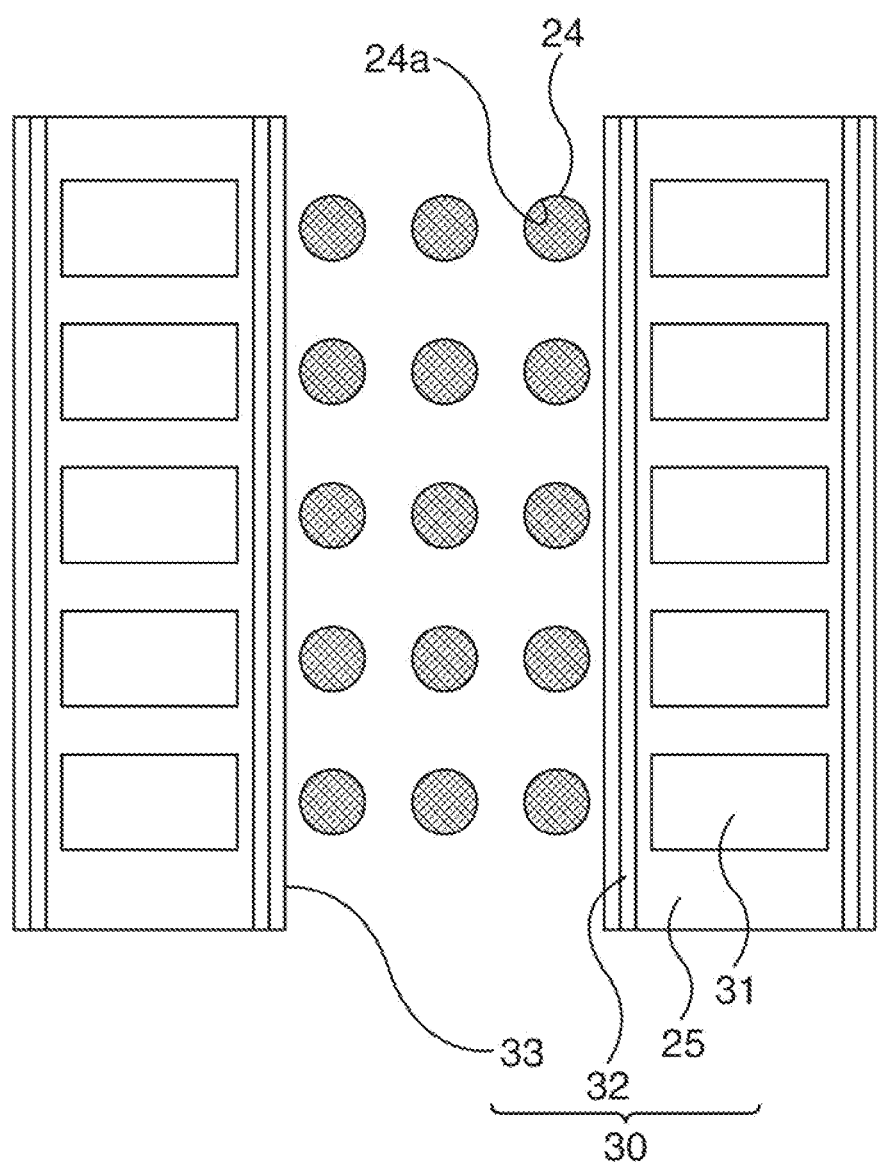
FIG. 11 is a schematic plan view illustrating, from above, the first protective film which has been patterned into an island shape.

FIG. 11 is a plan view illustrating, from above, the first protective film 33 which has been patterned into an island shape covering only the ferroelectric capacitor constructions 30. For patterning the first protective film 33, a reticle mask is used, wherein the reticle mask has a reticle pattern with a predetermined size greater than that of a reticle pattern used for patterning for the lower electrodes 32 at the regions aligning with the lower electrodes 32 of the ferroelectric capacitor constructions 30.

With the aforementioned patterning of the first protective film 33, it is possible to significantly increase the etching margin for the via holes 39a and reduce the contact resistance, thus enabling stably forming the second plugs 39 which will be described later, in comparison with cases of not etching the first protective film 33. The first protective film 33 is formed in order to suppress degradation of the capacitor constructions during processes and, therefore, the first protective film 33 is unnecessary for the logic-circuit regions other than the memory cells. With the aforementioned patterning, it is possible to leave the first protective film 33 only at the memory cell regions. Further, the first protective film 33 is collectively removed around the regions where the first plugs 24 are formed, which enables easily and certainly forming the second plugs 39, without being concerned about etching of the first protective film 33 due to positional deviations, during the formation of the via holes 39a. In this case, the first protective film 33 covers the ferroelectric capacitor constructions 30, thereby playing at least a required role in suppressing the degradation of characteristics of the ferroelectric capacitor constructions 30. Further, with the first protective film 33 in cooperation with the upper second protective films 35 which will be described later, namely with the entirety of the first and second protective films 33 and 35, it is possible to sufficiently suppress the characteristics degradation.

However, in the case where an end portion of the first protective film 33 is spaced apart by a small distance from the first plugs 24 adjacent to the end portion, due to the condition of positioning reference used in the patterning of the first protective film 33, it may become difficult to apply an etching process to the first protective film 33 such that it completely covers the ferroelectric capacitor constructions 30 but does not overlap with the first plugs 24. More specifically, the patterning for the lower electrodes 32 is performed utilizing the upper electrodes 31 as the positioning reference, while the patterning of the first protective film 33 is performed using the first plugs 24 as the positioning reference. Accordingly, during the patterning of the first protective film 33, the first protective film 33 is indirectly positioned with respect to the lower electrodes 32. This may possibly result in deviations of the end portions of the first protective film 33 from the lower electrodes 32, thus causing the first protective film 33 not to completely cover the ferroelectric capacitor constructions 30. On the other hand, if the first protective film 33 is patterned using the upper electrodes 31 as the positioning reference, this may cause overlaps between the end portions of the first protective film 33 and the first plugs 24, thus resulting in poor openings during the formation of the via holes 39*a*.

However, even in consideration of the aforementioned problems, in the case where significant positioning accuracy is not required, the first protective film 33 can be formed such that it completely covers the ferroelectric capacitor constructions 30 but does not overlap with the first plugs 24. Thus, the aforementioned patterning of the first protective film 33 is a method usable for offering excellent advantages as aforementioned.

Then, an annealing process is performed in order to repair damages of the ferroelectric capacitor constructions 30 caused by the respective processes during and after the formation of the ferroelectric capacitor constructions 30. Here, the annealing process is performed at a temperature of 650° C. in an oxygen atmosphere for 60 minutes.

Figure 10C:
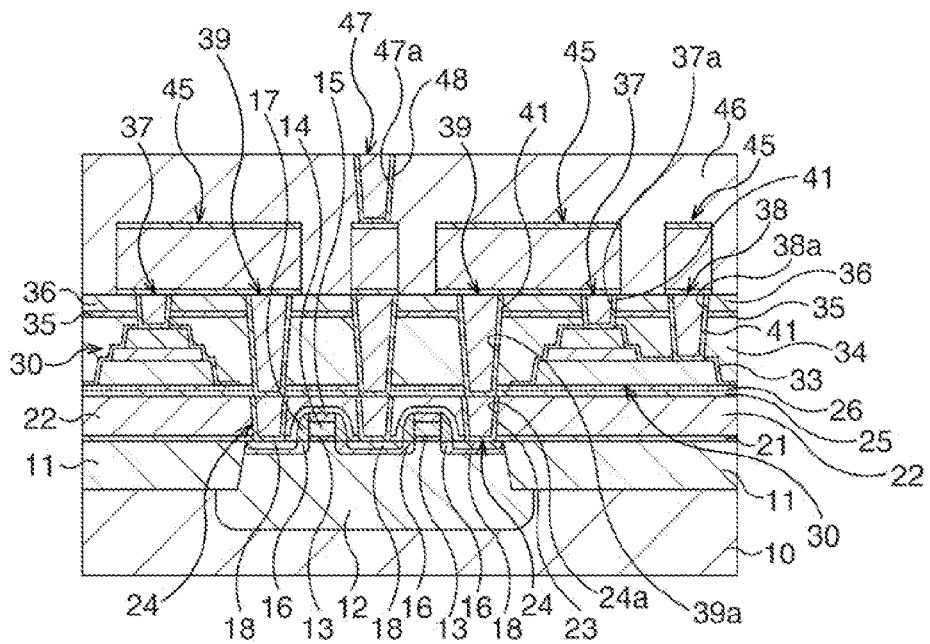

Subsequently, as illustrated in FIG. 10C, the same processes as those of FIGS. 3A and 3B and FIGS. 4A and 4B are performed to complete the formation of the ferroelectric memory.

Particularly, when forming the second plugs 39 which are connected to the first plugs 24 in the via-to-via construction, since the first protective film 33 does not exist at the portions at which the via holes 39*a* are to be formed, the via holes 39*a* are formed by processing, with lithography and subsequent dry etching, the five layers other than the first protective film 33, namely the oxide film 36, the second protective film 35, the second interlayer insulating layer 34, the orientation improving film 26 and the antioxidation film 25. Consequently, the second plugs 39 consisting of the via holes 39*a* and the W embedded therein are formed to be in non-contact with the first protective film 33.

The first and second plugs 24, 39 are formed to be a via-to-via construction in which the both plugs are electrically connected to each other. This via-to-via construction can increase the etching margin in forming the via holes, thus easing the aspect ratio of the via holes. Furthermore, the first protective film 33 is not etched when forming the via holes 39*a* of the second plugs 39, wherein the first protective film 33 is the most difficult to etch, out of the oxide film 36, the second protective film 35, the second interlayer insulating film 34, the first protective film 33, the orientation improving film 26 and the antioxidation film 25. Consequently, the via holes 39*a* can be formed to be desired shapes according to the resist pattern without reducing their bottom portions, thereby ensuring the connections between the second plugs 39 and the first plugs 24.

Further, the second protective film 35 is not processed as the first protective film 33 and the via holes 39*a* are formed when the second protective film 35 has been formed on the entire surface of the second interlayer insulating film 34, and then the second plugs 39 are formed such that the via holes 39*a* are filled therewith. Therefore, the constructions under the second protective film 35 are enclosed by the second protective film 35, the plugs 37, 39 and the second plugs 39, which can cause oxygen or hydrogen generated in subsequent processes to be blocked by the second protective film 35, the plugs 37, 39 and the second plugs 39, thereby suppressing deleterious effects on the lower layers including the ferroelectric capacitor constructions 30 (including degradations in the characteristics of the ferroelectric capacitor constructions 30).

As described above, according to the present embodiment, the ferroelectric capacitor constructions 30 are covered with the first protective film 33, and there is formed thereon the second protective film 35 which encloses the constructions under the second protective film 35 in cooperation with the plugs 37, 38 and the second plug 39, thereby sufficiently preventing degradations in the characteristics of the ferroelectric capacitor constructions 30 while sufficiently ensuring the connection between the electrically-connecting plugs 24, 39 to prevent poor contact and improve the yield. Thus, it is possible to realize a ferroelectric memory with high reliability. Furthermore, since the first protective film 33 has been collectively removed from the regions over the first plugs 24 at which the via holes 39*a* are to be formed, the via-to-via construction can be easily formed without being concerned about the occurrence of etching of the first protective film 33 due to positional displacements of the via holes 39*a* during the formation thereof.

(Second Modified Embodiment)

FIG. 12 is a schematic cross sectional view for describing main processes of the second modified embodiment which are particularly different from those of the first embodiment.

Figure 12A:
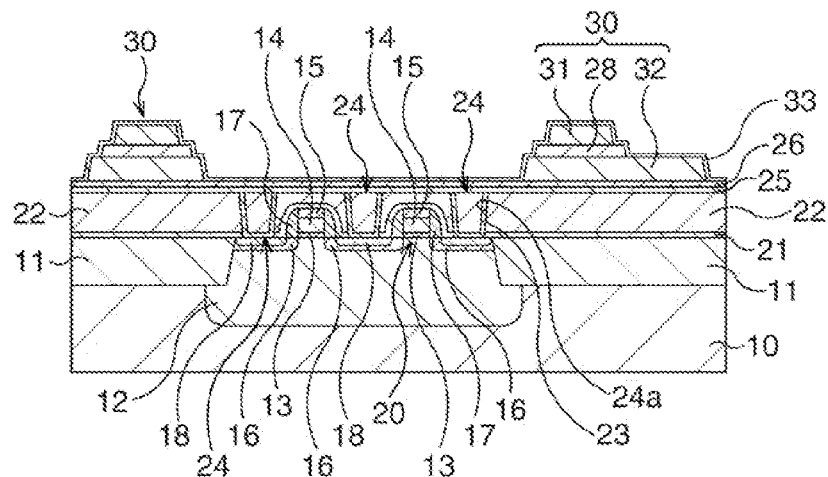
FIGS. 12A to 12C are schematic cross sectional views for describing main processes of a second modified embodiment of the first embodiment which are particularly different from those of the first embodiment.

In the present modified embodiment, similarly to in the first embodiment, firstly transistor constructions 20, first plugs 24, ferroelectric capacitor constructions 30 and a first protective film 33 are formed and, after the formation of them, the state of FIG. 12A corresponding to FIG. 2C is reached.

Figure 12B:
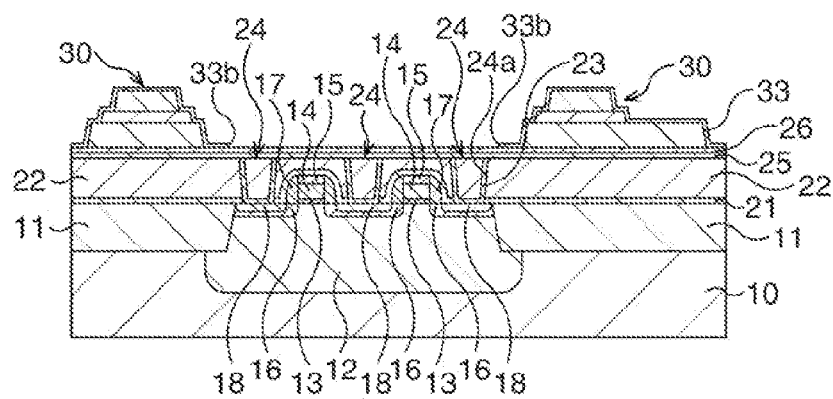

Subsequently, as illustrated in FIG. 12B, the first protective film 33 is processed.

More specifically, the first protective film 33 is processed by lithography and subsequent dry etching such that island-shaped portions of the first protective film 33 covering only the ferroelectric capacitor constructions 30 are left. At this time, the first protective film 33 is formed to have a size covering only the ferroelectric capacitor constructions 30, so to say, redundantly, namely a size only enough for overlapping with the upper surfaces of the first plugs 24. In this case, in order to prevent the first protective film 33 from overlapping with the upper surfaces of the first plugs 24 while patterning it into such a size, the first protective film 33 is formed to have, at its end portion adjacent to the first plugs 24, cutout portions 33*b* surrounding portions of the peripheral surfaces of the first plugs 24 adjacent to the end portion. For example, the first protective film 33 is patterned such that it has a width greater than the width of the lower electrodes 32 of the ferroelectric capacitor constructions 30 by about 1.2 micrometers and also the cutout portions 33b are sized to be greater than the hole diameter of the via holes 24a by, for example, about 0.28 micrometer.

Figure 13:
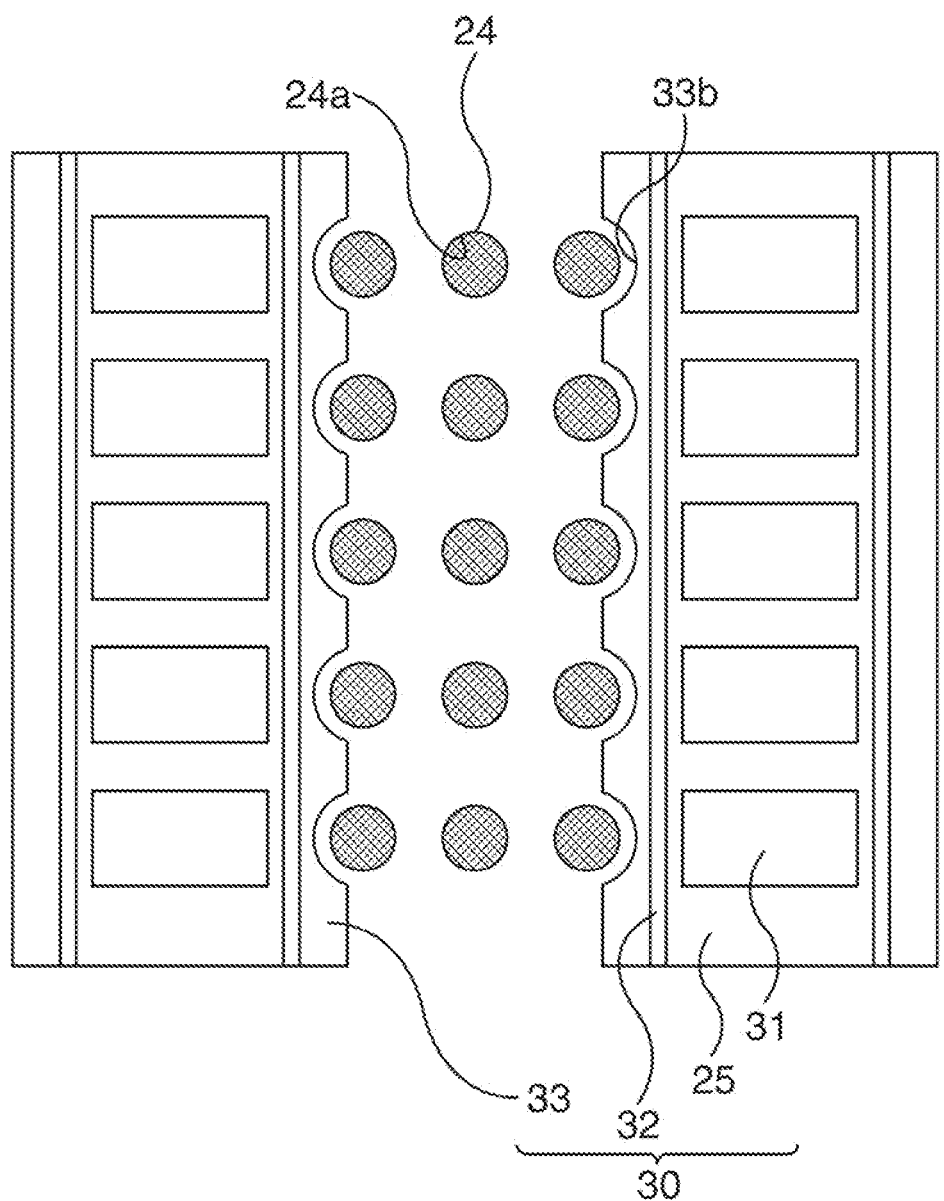
FIG. 13 is a schematic plan view illustrating, from above, the first protective film which has been patterned into an island shape, wherein cutout portions are formed in the first protective film.

FIG. 13 shows a plan view illustrating, from above, the first protective film 33 which have been patterned into island shapes covering only the ferroelectric capacitor constructions 30. For pattering the first protective film 33, a reticle mask is utilized, wherein the reticle mask has a reticle pattern for patterning for the via holes 24a at the regions aligning with the via holes 24a of the first plugs 24, wherein the reticle pattern has a predetermined diameter for via holes 24a adjacent to the end portions of the first protective film 33, the predetermined diameter being greater than that of the via holes 24a and the reticle mask further has a reticle pattern with a predetermined size greater than that of a reticle pattern used for patterning for the lower electrodes 32 at the regions aligning with the lower electrodes 32 of the ferroelectric capacitor constructions 30. Namely, the reticle mask used herein is the combination of the reticle mask of FIG. 5 according to the first embodiment and the reticle mask of FIG. 11 according to the first modified embodiment With the aforementioned patterning of the first protective film 33, it is possible to overcome the aforementioned drawbacks of the patterning of the first protective film 33 according to the first embodiment and the first modified embodiment and utilize only their advantages.

Namely, with the aforementioned patterning, it is possible to significantly increase the etching margin for the via holes 39a and reduce the contact resistance thereof, thereby enabling stably forming the second plugs 39 which will be described later, compared with the case where the first protective film 33 is not etched.

Furthermore, it is possible to leave the first protective film 33 only at the memory-cell regions where the first protective film 33 is required for suppressing the degradation of the ferroelectric capacitor constructions 30 during processes while not leaving the first protective film at the logic-circuit regions where it is unnecessary. Further, the first protective film 33 is collectively removed around the first plugs 24, which enables easily and certainly forming the plugs, without being concerned about etching of the first protective film 33 due to positional deviations during the formation of the via holes 39a. In this case, the first protective film 33 covers the ferroelectric capacitor constructions 30, thereby playing at least a required role in suppressing the degradation of characteristics of the ferroelectric capacitor constructions 30. Further, with the first protective film 33 in cooperation with the upper second protective film 35, namely with the entirety of the first and second protective films 33 and 35, it is possible to sufficiently suppress the degradation of characteristics.

Then, an annealing process is performed in order to repair damages of the ferroelectric capacitor constructions 30 caused by the respective processes during and after the formation of the ferroelectric capacitor constructions 30. Here, the annealing process is performed at a temperature of 650° C. in an oxygen atmosphere for 60 minutes.

Figure 12C:
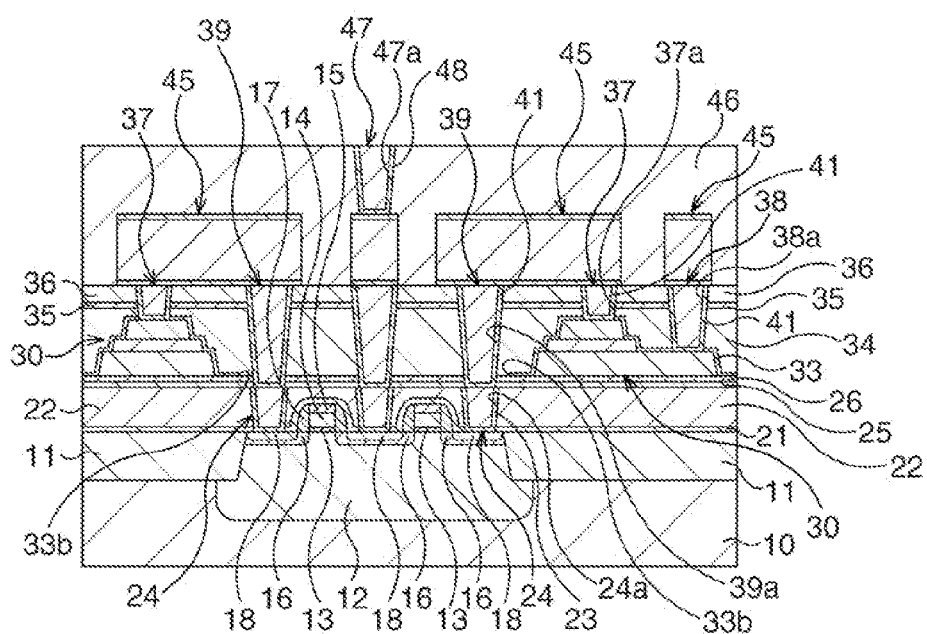

Subsequently, as illustrated in FIG. 12C, the same processes as those of FIGS. 3A and 3B and FIGS. 4A and 4B are performed to complete the formation of the ferroelectric memory.

Particularly, when forming the second plugs 39 which are connected to the first plugs 24 to be the via-to-via construction, since the first protective film 33 does not exist at the portions at which the via holes 39a are to be formed, the via holes 39a are formed by processing, with lithography and subsequent dry etching, the five layers other than the first protective film 33, namely the oxide film 36, the second protective film 35, the second interlayer insulating layer 34, the orientation improving film 26 and the antioxidation film 25. Consequently, the second plugs 39 consisting of the via holes 39a and the W embedded therein are formed to be in non-contact with the first protective film 33.

The first and second plugs 24, 39 are formed to be a via-to-via construction in which the both plugs are electrically connected to each other. This via-to-via construction can increase the etching margin in forming the via holes, thus easing the aspect ratio of the via holes. Furthermore, the first protective film 33 is not etched when forming the via holes 39a of the second plugs 39, wherein the first protective film 33 is the most difficult to etch, out of the oxide film 36, the second protective film 35, the second interlayer insulating film 34, the first protective film 33, the orientation improving film 26 and the antioxidation film 25. Consequently, the via holes 39a can be formed to be desired shapes according to the resist pattern without reducing their bottom portions, thereby ensuring the connections between the second plugs 39 and the first plugs 24.

Further, the second protective film 35 is not processed as the first protective film 33 and the via holes 39a are formed when the second protective film 35 has been formed on the entire surface of the second interlayer insulating film 34, and then the second plugs 39 are formed such that the via holes 39a are filled therewith. Therefore, the constructions under the second protective film 35 are enclosed by the second protective film 35, the plugs 37, 38 and the second plugs 39, which can cause oxygen or hydrogen generated in subsequent processes to be blocked by the second protective film 35, the plugs 37, 38 and the second plugs 39, thereby suppressing deleterious effects on the lower layers including the ferroelectric capacitor constructions 30 (including degradations in the characteristics of the ferroelectric capacitor constructions 30).

As described above, according to the present modified embodiment, the ferroelectric capacitor constructions 30 are covered with the first protective film 33, and there is formed thereon the second protective film 35 which encloses the constructions under the second protective film 35 in cooperation with the plugs 37, 38 and the second plug 39, thereby sufficiently preventing degradations in the characteristics of the ferroelectric capacitor constructions 30 while sufficiently ensuring the connection between the electrically-connecting plugs 24, 39 to prevent poor contact and improve the yield. Thus, it is possible to realize a ferroelectric memory with high reliability. Furthermore, since the first protective film 33 is collectively removed from the regions over the first plugs 24 where the via holes 39a are to be formed and also has the cutout portions 33b at its end portions, it is possible to form the first protective film 33 such that it sufficiently covers the ferroelectric capacitor constructions 30 without being concerned about etching of the first protective film 33 due to positional displacements during the formation of the via holes 39a, thereby easily and certainly realizing via-to-via constructions.

(Second Embodiment)

FIGS. 14 to 17 are views for describing problems solved by the present embodiment and FIGS. 18 to 20 are schematic cross sectional views illustrating the fabricating method of a ferroelectric memory according to the present embodiment in the order of processes. FIG. 22 is a schematic cross sectional view illustrating only main constructions of the present embodiment. In these figures, the same components as those of the ferroelectric memory according to the first embodiment are designated by the same reference characters.

When forming a via-to-via construction in fabricating the ferroelectric memory, the first plugs in a lower layer are formed prior to the formation of capacitor constructions and then an antioxidation film for the first plugs is formed. Subsequently, an orientation improving film for the lower electrodes of the capacitor constructions is formed and then a lower electrode layer of the capacitor constructions, a ferroelectric film and an upper electrode layer of the capacitor constructions are sequentially formed. During the formation of the capacitor constructions, a plurality of annealing processes are performed in an oxygen atmosphere.

Figure 14A:
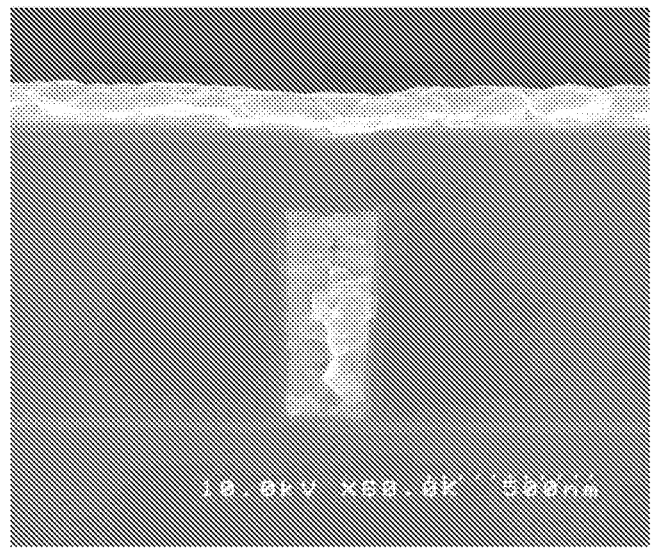
FIGS. 14A and 14B are SEM pictures for describing problems solved by a second embodiment.
Figure 14B:
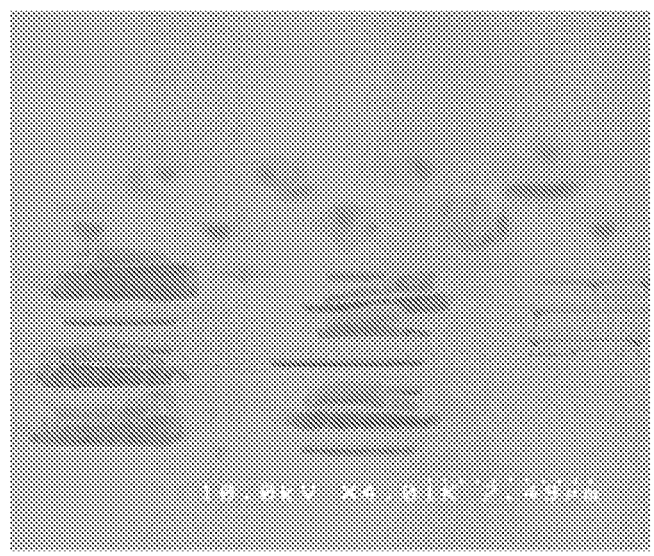
Figure 17A:
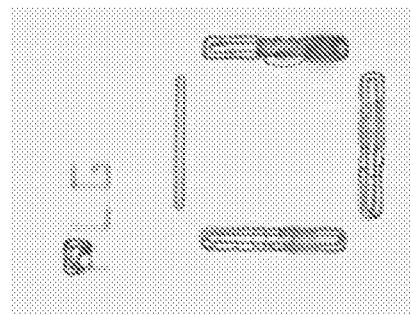
FIGS. 17A and 17B are SEM pictures for describing problems solved by the second embodiment.
Figure 17B:
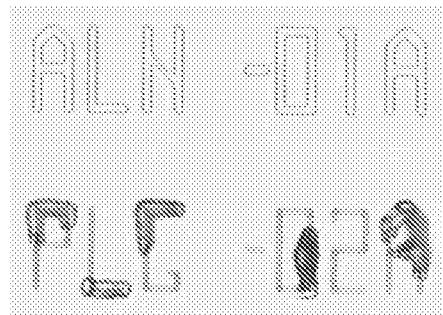

As can been seen in the SEM picture of FIG. 14A, the first plugs formed in the formation region in the semiconductor chip are completely filled with W and there is formed the antioxidation film covering the first plugs, which prevents the oxidation of the first plugs. On the contrary, as can be seen in the SEM picture of FIG. 14B, a patterning positioning mark formed outside the formation region of the semiconductor chip has a size of about a few μm, which is greater than the diameter of the via holes of the first plugs, and thus it is not completely filled with W.

As illustrated in FIG. 15A, usually, when forming the first plugs 24, the W film 51 which is embedded in the via holes 24a is formed to have a thickness which can completely fill the via holes 24a through the glue film 23. On the other hand, as illustrated in FIG. 15B, if the antioxidation film 25 is formed when the hole 50 of the positioning mark 52 is not completely filled with the W film 51 through the glue film 23, this will cause concavity and convexity on the surface 51a of the W film 51, and such concavity and convexity degrade the coverage of the antioxidation film at the side wall portions of the via hole 24a. FIG. 16 presents a SEM picture showing such a state. The degradation of the coverage will cause oxidation of the W embedded in the positioning mark, as can be seen in SEM pictures of FIGS. 17A and 17B, in the oxygen atmosphere during the formation of the capacitors. If oxidation of the positioning mark occurs, this will make it difficult to achieve accurate positioning in the subsequent processes. Furthermore, the oxidized W may be flaked from the via holes, thereby making it impossible to perform subsequent processes.

The present inventor has reached following two technical concepts, in order to suppress, when forming first plugs in a lower layer in a via-to-via construction, the oxidation of the first-plug conductive material (mainly, W) in the positioning mark which is formed in the same layer as the first plugs outside the formation region of the semiconductor chip.

Figure 18A:
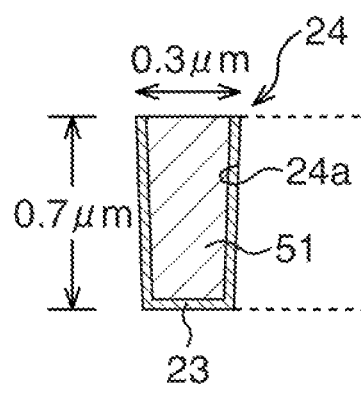
FIGS. 18A and 18B are schematic views for describing a first manner according to the second embodiment.
Figure 18B:
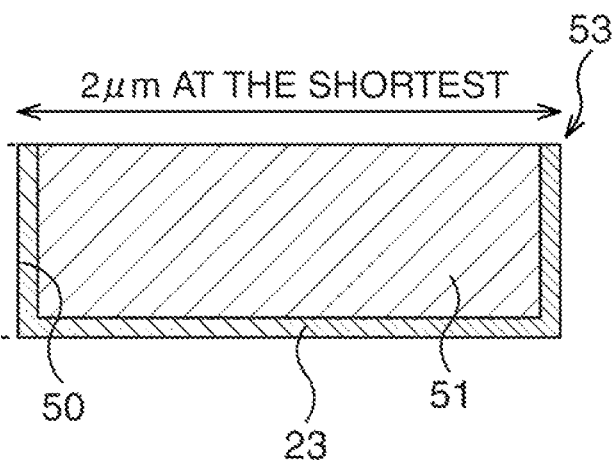

As the first technique, as illustrated in FIG. 18A, when forming the first plug 24, the W film 51 is deposited to have a thickness of a value equivalent to or greater than the depth of the via hole 24a and thus it is embedded in the via hole 24a. As illustrated in FIG. 18B, the via hole 24a and the hole 50 are formed to have substantially the same depth, and, when the W film 51 has a thickness equal to or greater than the depth, the W film 51 can sufficiently fills the hole 50 even when the hole 50 has a larger diameter (for example, about 2 μm) than that of the via hole 24a (for example, about 0.3 μm). Consequently, by subsequently forming an antioxidation film, it is possible to suppress the oxidation of the W film 51 in the positioning mark 53 as well as in the first plug 24.

Figure 19A:
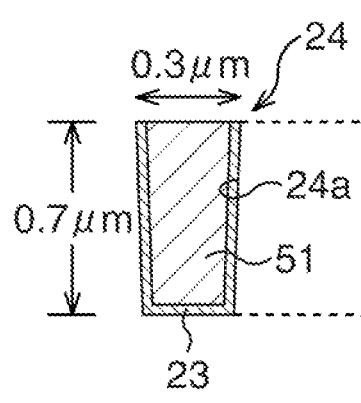
FIGS. 19A and 19B are schematic views for describing a second manner according to the second embodiment.
Figure 19B:
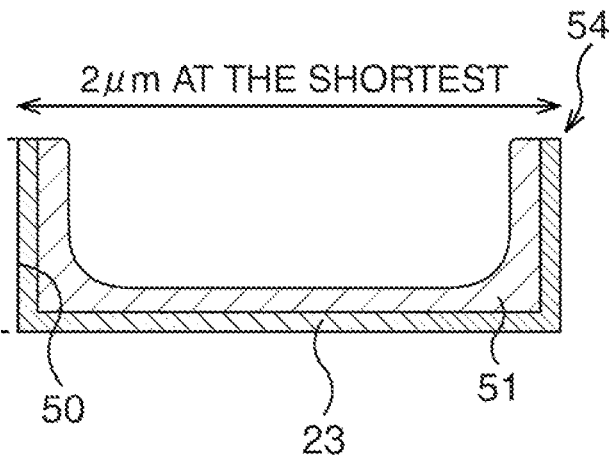

As the second technique, as illustrated in FIG. 19A, when forming the first plug 24, the deposition temperature for the W film 51 is set to a predetermined temperature within the range of from 400 to 500° C. to embed the W film 51 in the via hole 24a. As illustrated in FIG. 19B, by depositing it at a film-formation temperature of 400° C. or more, the surface of the W film 51 can be made smooth, thereby improving the coverage of the antioxidation film which will be formed later. Consequently, by subsequently forming an antioxidation film, it is possible to suppress the oxidation of the W film 51 in the positioning mark 53 as well as in the first plug 24. If the deposition temperature for the W film 51 is set to below 400° C., the W film 51 can not be formed to have a sufficient smooth surface. Also, it is not realistic to set the deposition temperature for the W film to above 500° C.

Further, Patent Document 2 discloses a plurality of wirings formed in the same layer in an integrated circuit, wherein the ratio of the greatest width to the smallest width of the wirings is within the range of from 4 to 17, the ratios of the heights to the widths of the respective wirings are within the range of from 0.6 to 1.6, the wirings contain cupper or cupper alloys and are covered with a diffusion prevention film. In the present invention, the first plugs 24 have a height-to-width ratio of 1.6 or more. Patent Document 1 does not disclose a configuration in which wirings (the first plugs 24 in the present invention) are covered with a diffusion prevention film. Thus, the present invention differs form these inventions.

Hereinafter, there will be described the construction and the fabrication method of a ferroelectric memory, as concrete embodiments to which the present invention is applied.

FIGS. 20 to 22 are schematic cross sectional views illustrating the fabricating method of a ferroelectric memory according to the present embodiment, in the order of the processes.

Figure 20A:
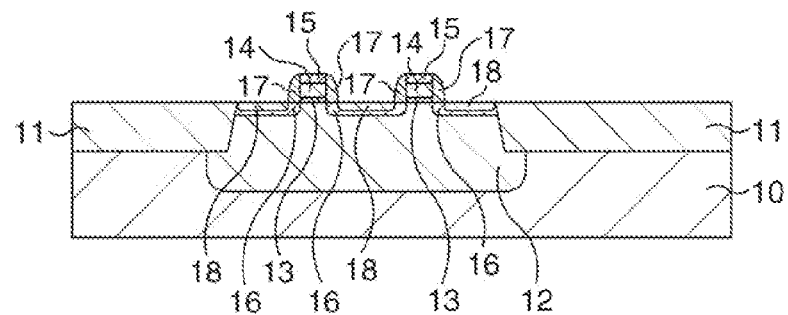
FIGS. 20A to 20E are schematic cross sectional views illustrating the fabricating method of a ferroelectric memory according to the second embodiment, in the order of the processes.

At first, as illustrated in FIG. 20A, MOS transistors 20 which function as selection transistors are formed on a silicon semiconductor substrate 10.

More specifically, a device separation construction 11 is formed by a STI (Shallow Trench Isolation) process, for example, on the surface layer of the silicon semiconductor substrate 10 to define a device activation region.

Subsequently, an impurity is implanted into the device activation region to form a well 12. In this case, B is implanted into the device activation region by ion implantation with a dose amount of $3.0 \times 10^{14}/cm^2$ and an acceleration energy of 300 keV.

Then, a thin gate insulating film 13 with a thickness of about 3.0 nm is formed on the device activation region, for example, by thermal oxidation. Then, a polycrystalline silicon film with a thickness of about 180 nm and, for example, a silicon nitride film with a thickness of about 29 nm are deposited on the gate insulating film 13 by CVD processes. Then, the silicon nitride film, the polycrystalline silicon film and the gate insulating film 13 are processed by lithography and subsequent dry etching into an electrode shape to pattern-form gate electrodes 14 on the gate insulating film 13. At this time, concurrently, cap films 15 made of silicon nitride films are pattern-formed on the gate electrodes 14.

Subsequently, an impurity is implanted into the device activation region while the cap films 15 are utilized as masks to form so-called LLD regions 16. In this case, As is implanted into the device activation region by ion implantation, for example, with a dose amount of $5.0 \times 10^{14}/cm^2$ and an acceleration energy of 10 keV.

Next, a silicon oxide film, for example, is deposited on the entire surface by a CVD process. Then, so-called etching-back is applied to this silicon oxide film such that it is left only on the side surfaces of the gate electrodes 14 and the cap films 15 to form side-wall insulating films 17.

Subsequently, an impurity is implanted into the device activation region while the cap films 15 and the side-wall insulating films 17 are utilized as masks to form source/drain regions 18 overlaid on the LDD regions 16, under a condition which causes the impurity concentration thereof to be higher than that of the LDD regions 16. In this case, P is implanted into the device activation region by ion implantation with a dose amount of $5.0 \times 10^{14}/cm^2$ and an acceleration energy of 13 keV. Thus, the formation of the MOS transistors 20 is completed.

Figure 20B:
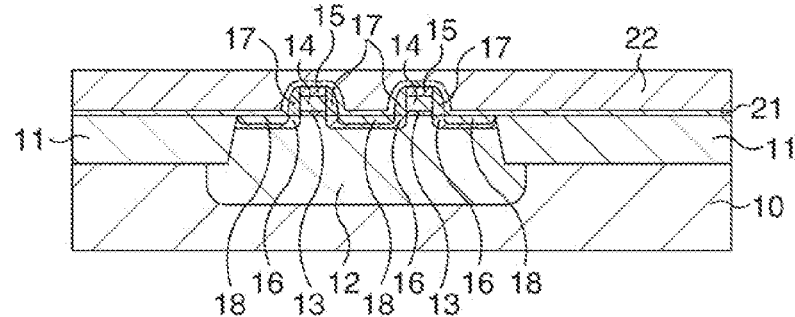

Subsequently, as illustrated in FIG. 20B, a protective film 21 and a first interlayer insulating film 22 for the MOS transistors 20 are formed.

More specifically, the protective film 21 and the first interlayer insulating film 22 are sequentially deposited such that they cover the MOS transistors 20. Here, as the protective film 21, a silicon oxide film with a thickness of about 20 nm is deposited by a CVD process. As the first interlayer insulating film 22, for example, a plasma SiO film (with a thickness of about 20 nm), a plasma SiN film (with a thickness of about 80 nm) and a plasma TEOS film (with a thickness of about 1000 nm) are sequentially deposited to form a laminated-layer construction and, after the deposition thereof, the construction is polished by CMP to a thickness of about 700 nm.

Figure 20C:
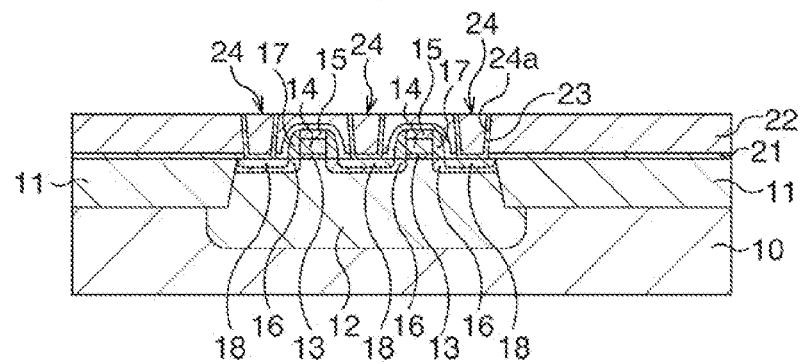

Then, as illustrated in FIG. 20C, first plugs 24 connected to the source/drain regions 18 are formed.

More specifically, via holes 24a with a diameter of about 0.25 μm and a depth of about 0.7 μm, for example, are formed by processing the first interlayer insulating film 22 and the protective film 21 by lithography and subsequent dry etching until a portion of the surfaces of the source/drain regions 18 are exposed. At this time, a positioning mark having a hole diameter of at least about 2 μm and at a maximum 10 μm and having a depth of about 0.7 μm is concurrently formed in the same layer as the via holes 24a outside the formation region of the semiconductor chip. Also, via holes with a diameter of 0.25 μm or more (needless to say, 10 μm or less) and a depth of about 0.7 μm may be concurrently formed in peripheral circuit portions, etc.

Then, a Ti film (with a thickness of about 30 nm) and a TiN film (with a thickness of about 20 nm), for example, are deposited with sputtering processes such that they cover the wall surfaces of the via holes 24a to form an underlying film (glue film) 23. Then, a tungsten (W) film, for example, is formed to have a thickness equal to or greater than the depth of the via holes 24a, about 800 nm in this case, by a CVD process such that it fills the via holes 24a through the glue film 23. Then, the W film and the glue film 23 are polished with CMP using the first interlayer insulating film 22 as the stopper to form first plugs 24 consisting of the via holes 24a and W embedded therein through the glue films 23. At this time, a positioning mark constituted by the W film sufficiently embedded in a hole is formed outside the formation region of the semiconductor chip.

Figure 20D:
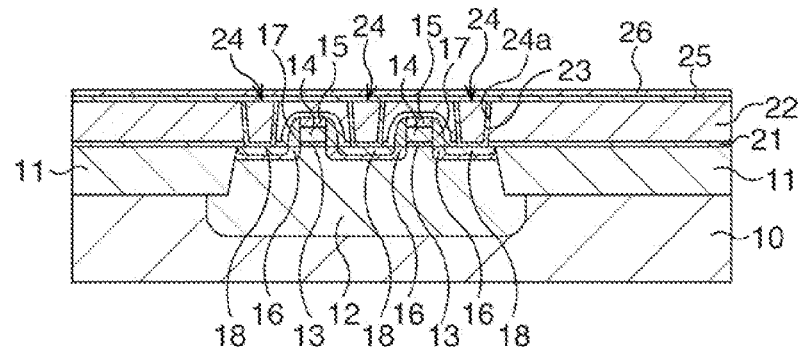

Then, as illustrated in FIG. 20D, an antioxidation film 25 for the firs plugs 24 and an orientation improving film 26 for a lower electrode are formed.

More specifically, the antioxidation film 25 is formed in order to prevent the oxidation of the first plugs 24 caused by thermal annealing in an oxygen atmosphere during the formation of the ferroelectric capacitor constructions. The antioxidation film 25 is formed to be, for example, a laminated-layer construction consisting of, for example, SiON (with a thickness of about 130 nm) and plasma TEOS (with a thickness of about 130 nm). By forming the antioxidation film 25, it is possible to suppress the oxidation of the W film in the positioning mark (and the via holes in the peripheral circuit portions, etc.) as well as in the first plugs 24. The orientation improving film 26 is, for example, a silicon oxide film.

Figure 20E:
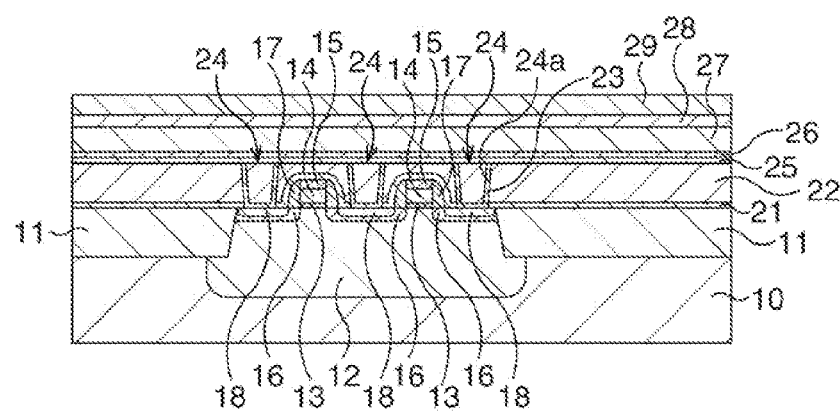

Subsequently, as illustrated in FIG. 20E, a lower electrode layer 27, a ferroelectric film 28 and an upper electrode layer 29 are sequentially formed.

More specifically, at first, a Ti film with a thickness of about 20 nm and a Pt film with a thickness of about 150 nm, for example, are sequentially deposited by sputtering processes to form a lower electrode layer 27 having a laminated-layer construction consisting of a Ti film and a Pt film. Then, by an RF sputtering process, a ferroelectric film 28 with a thickness of about 200 nm made of, for example, PZT which is a ferroelectric is deposited on the lower electrode layer 27. Then, an RTA process is applied to the ferroelectric film 28 to crystallize the ferroelectric film 28. Subsequently, by a reactive sputtering process, an upper electrode layer 29 with a thickness of about 200 nm made of, for example, $IrO_2$ which is a conductive oxide is deposited on the ferroelectric film 28. Further, the material of the upper electrode layer 29 may be Ir, Ru, $RuO_2$, $SrRuO_3$, other conductive oxides or laminated-layer construction consisting thereof, instead of $IrO_2$.

Figure 21A:
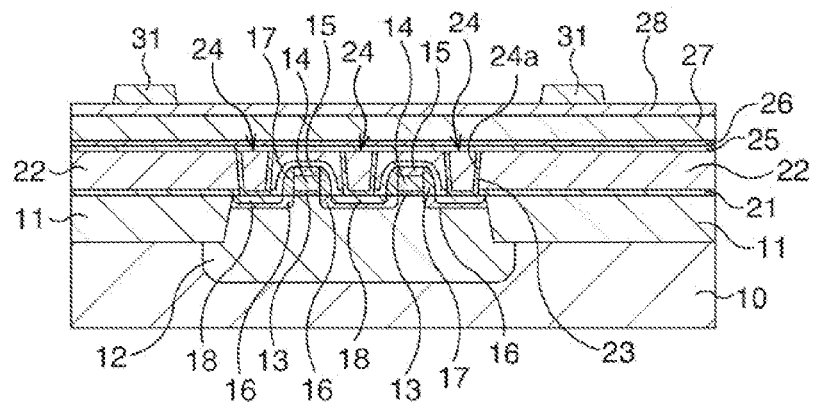
FIGS. 21A to 21D are schematic cross sectional views illustrating the fabricating method of the ferroelectric memory according to the second embodiment, in the order of the processes, subsequently to FIG. 20.

Then, as illustrated in FIG. 21A, upper electrodes 31 are pattern-formed.

More specifically, the upper electrode layer 29 is processed into a plurality of electrodes by lithography and subsequent dry etching to pattern-form a plurality of upper electrodes 31.

Figure 21B:
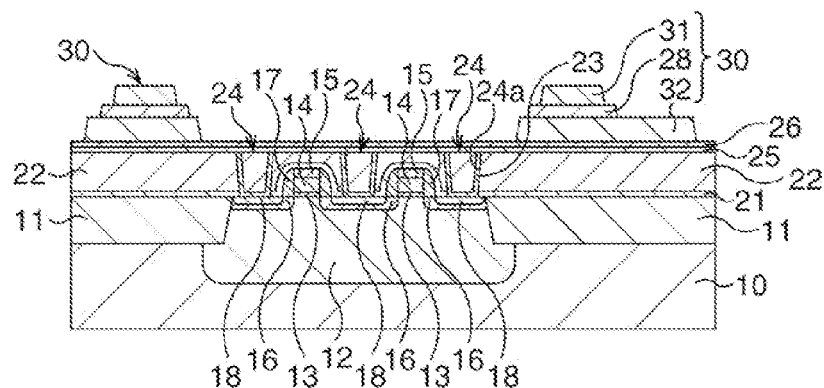

Subsequently, as illustrated in FIG. 21B, the ferroelectric film 28 and the lower electrode layer 27 are processed to form ferroelectric capacitor constructions 30.

More specifically, at first, the ferroelectric film 28 is processed by lithography and subsequent dry etching such that it is aligned with the upper electrodes and is sized to be slightly greater than the upper electrodes 29.

Next, lower electrodes 32 are pattern-formed by processing the lower electrode layer 27 by lithography and subsequent dry etching such that it is aligned with the processed ferroelectric film 28 and is sized to be slightly greater than the ferroelectric film 28. Thus, the formation of the ferroelectric capacitor constructions 30 has been completed, wherein the ferroelectric film 28 and the upper electrode 31 have been sequentially laminated on the lower electrode 32 and the lower electrode 32 and the upper electrode 31 have been capacitively coupled to each other through the ferroelectric film 28.

Figure 21C:
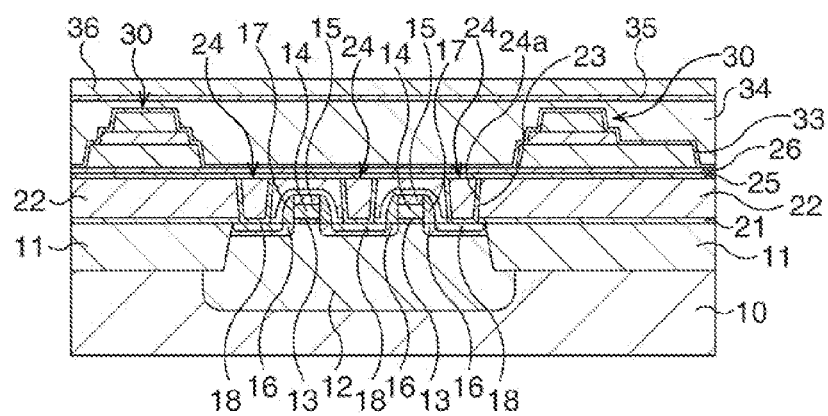

Then, as illustrated in FIG. 21C, a first protective film 33, a second interlayer insulating film 34, a second protective film 35 and an oxidation film 36 are formed.

More specifically, the first protective film 33, the second interlayer insulating film 34, the second protective film 35 and the oxide film 36 are sequentially deposited such that they cover the ferroelectric capacitor constructions 30. Here, the first protective film 33 is for preventing damages of the ferroelectric capacitor constructions 30 which would be otherwise caused by the multi-layer processing after the formation of the ferroelectric capacitor constructions 30 and is formed from, for example, alumina to be a thickness of about 20 nm by a sputtering process. After the formation of the first protective film 33, an annealing process is performed in order to repair damages of the ferroelectric capacitor constructions 30 caused by the respective processes during and after the formation of the ferroelectric capacitor constructions 30. Here, the annealing process is performed at a temperature of 650° C. and in an oxygen atmosphere for 60 minutes. The second interlayer insulating film 34 is formed, for example, by depositing a plasma TEOS film with a thickness of about 1400 nm and then polishing it by CMP to a thickness of about 1000 nm. After the CMP, for the sake of dewatering of the second interlayer insulating film 34, an $N_2O$ plasma annealing process is applied thereto. The second protective film 35 is for preventing damages of the ferroelectric capacitor constructions 30 which would be otherwise caused by subsequent multi-layer processing and is formed from, for example, alumina to be a thickness of about 50 nm by a sputtering process. The oxide film 36 is formed, for example, by depositing a plasma TEOS film with a thickness of about 300 nm.

Figure 21D:
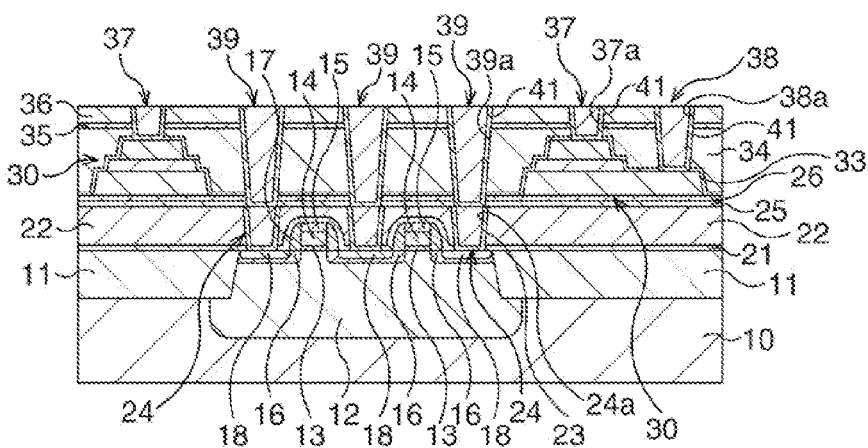

Then, as illustrated in FIG. 21D, plugs 37, 38 for the ferroelectric capacitor constructions 30 and the second plugs 39 connected to the first plugs 24 are formed.

At first, via holes 37a, 38a extending to the ferroelectric capacitor constructions 30 are formed.

More specifically, the oxide film 36, the second protective film 35, the second interlayer insulating film 34 and the first protective film 33 are processed by lithography and subsequent dry etching until a portion of the surfaces of the upper electrodes 31 is exposed, and concurrently the oxide film 36, the second protective film 35, the second interlayer insulating film 34 and the first protective film 33 are processed by lithography and subsequent dry etching until a portion of the surfaces of the lower electrodes 32 is exposed. Thus, via holes 37a, 38a with a diameter of about 0.5 μm, for example, are concurrently formed at the respective portions. During the formation of the via holes 37a, 38a, the upper electrodes 31 and the lower electrodes 32 respectively function as etching stoppers.

Then, an annealing process is performed in order to repair damages of the ferroelectric capacitor constructions 30 caused by the respective processes after the formation of the ferroelectric capacitor constructions 30. In this case, an annealing process is performed at a temperature of 500° C. in an oxygen atmosphere for 60 minutes.

Then, the via holes 39a extending to the first plugs 24 are formed.

More specifically, the via holes 39a with a diameter of, for example, about 0.3 μm are formed as follows. The oxide film 36, the second protective film 35, the second interlayer insulating film 34, the orientation improving film 26 and the oxidation prevention film 25 are processed by lithography and subsequent dry etching by utilizing the first plugs 24 as etching stoppers until a portion of the surfaces of the first plugs 24 is exposed.

Next, the plugs 37, 38 and the second plugs 39 are formed.

At first, an RF preparation for treating about a few tens nm, about 10 nm in this case, on the basis of etching of an ordinary oxide film, is performed. Then, a TiN film with a thickness of about 75 nm is deposited by a sputtering process to form an underlying film (glue film) 41 such that it covers the respective wall surfaces of the via holes 37a, 38a, 39a. Then, for example, a W film is formed by a CVD process such that the via holes 37a, 38a and 39a are filled with the W film through the glue film 41. Then, the W film and the glue film 41 are polished by CMP using the oxide film 36 as the stopper to form the plugs 37, 38 and the second plugs 24 constituted by the via holes 37a, 38a and 39a and the W embedded therein through the glue films 41. The first and second plugs 24, 39 are formed to be a so-called via-to-via construction in which the both plugs are electrically connected to each other. This via-to-via construction may increase the etching margin in forming the via holes, thus easing the aspect ratio of the via holes.

Figure 22A:
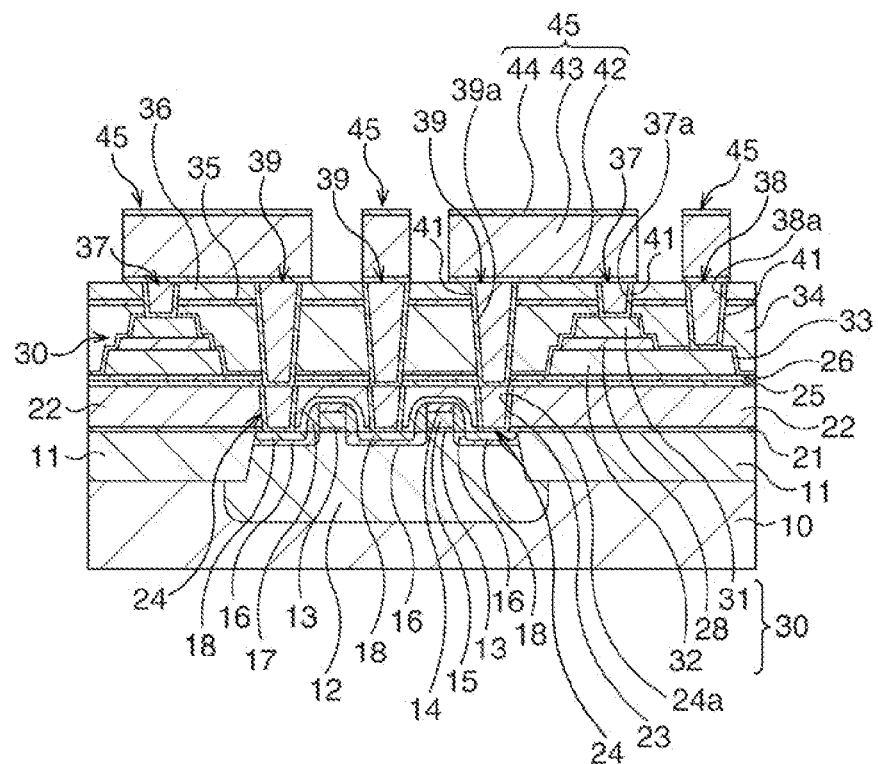
FIGS. 22A and 22B are schematic cross sectional views illustrating the fabricating method of the ferroelectric memory according to the second embodiment, in the order of the processes, subsequently to FIG. 21.

Subsequently, as illustrated in FIG. 22A, wirings 45 connected to the plugs 37, 38 and the second plugs 39 are formed.

More specifically, at first, a barrier metal film 42, a wiring film 43 and a barrier metal film 44 are deposited on the entire surface by sputtering processes, etc. As the battier metal film 42, for example, a Ti film (with a thickness of about 60 nm) and a TiN film (with a thickness of about 30 nm) are sequentially formed by sputtering processes. As the wiring film 43, for example, an Al alloy film (an Al—Cu film, in this case) with a thickness of about 360 nm is formed. As the barrier metal film 44, for example, a Ti film (with a thickness of about 5 nm) and a TiN film (with a thickness of about 70 nm) are sequentially formed by sputtering processes. At this time, the wiring film 43 has the same construction as those of the logic sections of the same rule other than FeRAMs, and there is no problem in terms of the wiring processes and the reliability.

Next, a SiON film (not shown), for example, is formed as an antireflection film. Then, by lithography and subsequent dry etching, the antireflection film, the barrier metal film 44, the wiring film 43 and the barrier metal film 42 are processed into wiring shapes to pattern-form the wirings 45. Further, instead of forming an Al alloy film as the wiring film 43, a Cu film (or a Cu alloy film) may be formed by a so-called damascene process and Cu wirings may be formed as the wirings 45.

Figure 22B:
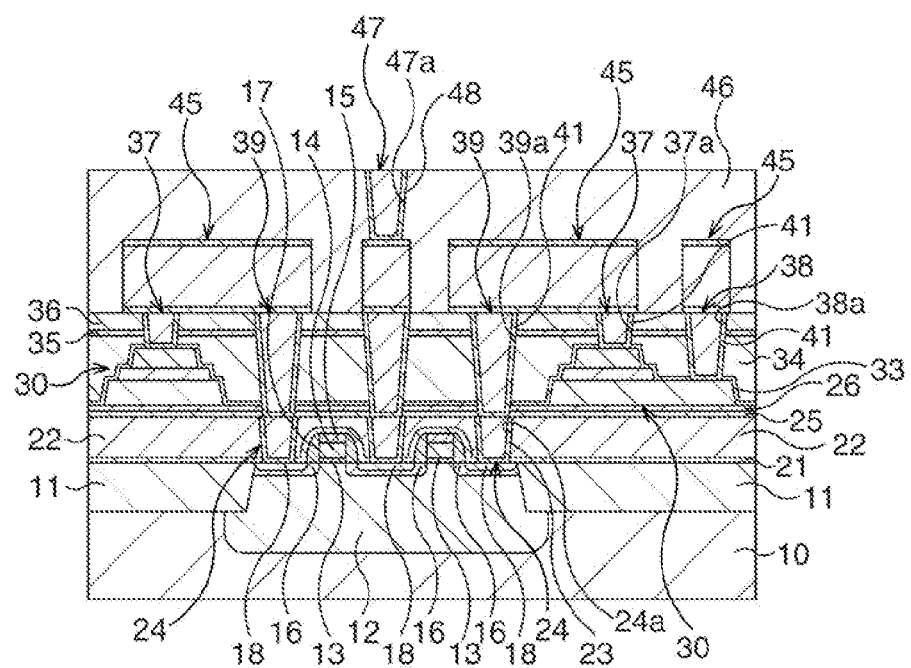

Then, as illustrated in FIG. 22B, a third interlayer insulating film 46, a third plug 47, and wirings thereon are formed to complete the formation of the FeRAM.

More specifically, at first, a third interlayer insulating film 46 is formed such that it covers the wirings 45. The third interlayer insulating film 46 is formed by forming a silicon oxide film with a thickness of about 700 nm, then forming a plasma TEOS thereon such that the total thickness is about 1100 nm and then polishing the surface thereof to a thickness of about 750 nm.

Next, a plug 47 connected to the wirings 45 is formed.

The third interlayer insulating film 46 is processed by lithography and subsequent dry etching until a portion of the surface of the wirings 45 is exposed to form a via hole 47a with a diameter of, for example, about 0.25 μm. Then, an underlying film (glue film) 48 is formed such that it covers the wall surfaces of the via hole 47a. Then, a W film is formed by a CVD process such that the via hole 47a is filled with the W film through the glue film 48. Then, for example, the W film and the glue film 48 are polished using the third interlayer insulating film 46 as the stopper to form the plug 47 constituted by the via hole 47a and the W embedded therein through the glue film 48.

Then, the processes for forming wirings as an upper layer, an interlayer insulating film and plugs are repeated to form a wiring construction (not shown) consisting of, for example, five layers including the wirings 45. Subsequently, a first cover film and a second cover film (not shown) are formed. In this case, an HDP-USG film with a thickness of about 720 nm is deposited as the first cover film, for example and a silicon nitride film with a thickness of about 500 nm is deposited as the second cover film, for example. Further, a contact for connection to a pad is formed in the five-layer construction. Then, a polyimide film (not shown), for example, is formed and patterned to complete the formation of the FeRAM according to the present embodiment.

As described above, with the present embodiment, it is possible to suppress the oxidation of W being an oxidation-prone metal which is embedded in the positioning mark as well as in the first plugs 24, thereby providing a reliable semiconductor device (a ferroelectric memory, in this case).

(Modified Embodiment)

Hereinafter, a modified embodiment of the second embodiment will be described. In the present modified embodiment, there will be disclosed the construction and the fabricating method of a ferroelectric memory similarly to in the second embodiment. The present modified embodiment is slightly different from the second embodiment in the formation processes for the first plugs 24.

In the present modified embodiment, at FIG. 20C, after the processes of FIGS. 20A and 20B, a W film, for example, is formed to have a thickness of about 300 nm to fill the via holes 24a through the glue film 23 by a CVD process at a predefined deposition temperature within the range of from 400 to 500° C., at a temperature of 400° C. in this case. By forming the W film at such a high temperature, it is possible to embed the W film in the via holes 24a and to deposit the W film with smooth surfaces on the side walls of the hole of the positioning mark. Then, the W film and the glue film 23 are polished with CMP using the first interlayer insulating film 22 as the stopper to form first plugs 24 consisting of the via holes 24a and W embedded therein through the glue films 23. At this time, the positioning mark constituted by the W film sufficiently embedded in the hole is formed outside the formation region of the semiconductor chip.

Then, as illustrated in FIG. 20D, an antioxidation film 25 for the first plugs 24 and an orientation improving film 26 for a lower electrode are formed. The antioxidation film 25 is formed to be, for example, a laminated-layer construction consisting of, for example, SiON (with a thickness of about 130 nm) and plasma TEOS (with a thickness of about 130 nm). By forming the antioxidation film 25, it is possible to suppress the oxidation of the W film in the positioning mark (and the via holes in the peripheral circuits, etc.) as well as in the first plugs 24.

Then, the same processes as those of FIG. 20E, FIGS. 21A to 21D and FIGS. 22A and 22B are performed to complete the formation of the FeRAM according to the present modified embodiment.

As described above, with the present modified embodiment, it is possible to suppress the oxidation of W being an oxidation-prone metal which is embedded in the positioning mark as well as in the first plugs 24, thereby providing a reliable semiconductor device (a ferroelectric memory, in this case).

The present invention is not limited to the aforementioned first and second embodiments and the aforementioned modified embodiments. For example, it is possible to combine the first and second embodiments (or the respective modified embodiments), namely it is also possible to process the first protective film 33 as in the first embodiment or the modified embodiment thereof and adjust the thickness and the deposition temperature of the W film in forming the first plugs 24 as in the second embodiment or the modified embodiment thereof, in order to provide the respective effects of the first and second embodiments (or the respective modified embodiments).

With the present invention, it is possible to sufficiently suppress degradations of the characteristics of capacitor constructions, and to reduce poor contacts and improve the yield while ensuring connections of electrically-connecting plugs, thereby enabling realization of a reliable semiconductor device.

What is claimed is:

1. A semiconductor device comprising:
a semiconductor substrate;
a first insulating film including at least a first interlayer insulating film formed above said semiconductor substrate;
a first plug including a conductive material which fills a first connecting hole formed in said first insulating film;
a capacitor construction comprising a lower electrode, an upper electrode and a dielectric film therebetween;
a second insulating film having a laminated-layer construction including a first protective film and a second protective film for preventing degradations of the characteristics of said capacitor construction, said first protective film and said second protective film being laminated with a second interlayer insulating film interposed therebetween and said second insulating film being formed to cover said capacitor construction; and
a second plug including a conductive material which fills a second connecting hole, said second connecting hole being formed in said second insulating film such that said first plug is exposed at least at a portion thereof;
wherein said first protective film is removed at least at the portion which corresponds to said second connecting hole and is not in contact with said second plug and said first protective film is formed to cover at least said capacitor construction;
wherein said first protective film is formed to be an island shape which covers only said capacitor construction; and
wherein said second protective film is an insulating film, and said second plug is formed to penetrate said second protective film.

2. A semiconductor device comprising:
a semiconductor substrate;
a first insulating film including at least a first interlayer insulating film formed above said semiconductor substrate;
a first plug including a conductive material which fills a first connecting hole formed in said first insulating film;
a capacitor construction comprising a lower electrode, an upper electrode and a dielectric film therebetween;
a second insulating film having a laminated-layer construction including a first protective film and a second protective film for preventing degradations of the characteristics of said capacitor construction, said first protective film and said second protective film being laminated with a second interlayer insulating film interposed therebetween and said second insulating film being formed to cover said capacitor construction; and
a second plug including a conductive material which fills a second connecting hole, said second connecting hole being formed in said second insulating film such that said first plug is exposed at least at a portion thereof;
wherein said first protective film is removed at least at the portion which corresponds to said second connecting hole and is not in contact with said second plug and said first protective film is formed to cover at least said capacitor construction;
wherein said first protective film is formed to be an island shape which covers only said capacitor construction, and at an end portion of said first protective film near said first plug, a cutout is formed apart from said first plug and to surround a portion of the peripheral surface of said first plug; and
wherein said second protective film is an insulating film, and said second plug is formed to penetrate said second protective film.

3. A semiconductor device comprising:
a semiconductor substrate;
a construction which is pattern-formed above said semiconductor substrate;
an insulating film having a laminated-layer construction including a first protective film and a second protective film for preventing degradations of the characteristics of said construction, said first protective film and said second protective film being laminated with an interlayer insulating film interposed therebetween and said insulating film being formed to cover said construction; and a plug including a conductive material which fills a connecting hole formed in said insulating film;

wherein said first protective film is removed at least at the portion which corresponds to said connecting hole and is not in contact with said plug and said first protective film is formed to cover at least said construction;

wherein said first protective film is formed to be an island shape which covers only said construction; and wherein said second protective film is an insulating film, and said second plug is formed to penetrate said second protective film.

4. A semiconductor device comprising:

a semiconductor substrate;

a construction which is pattern-formed above said semiconductor substrate;

an insulating film having a laminated-layer construction including a first protective film and a second protective film for preventing degradations of the characteristics of said construction, said first protective film and said second protective film being laminated with an interlayer insulating film interposed therebetween and said insulating film being formed to cover said construction; and a plug including a conductive material which fills a connecting hole formed in said insulating film;

wherein said first protective film is removed at least at the portion which corresponds to said connecting hole and is not in contact with said plug and said first protective film is formed to cover at least said construction;

wherein said first protective film is formed to be an island shape which covers only said construction, and at an end portion of said first protective film near said plug, a cutout is formed apart from said plug and to surround a portion of the peripheral surface of said plug; and wherein said second protective film is an insulating film, and said second plug is formed to penetrate said second protective film.

5. A semiconductor device comprising:

a semiconductor substrate;

a first insulating film including at least a first interlayer insulating film formed above said semiconductor substrate;

a first plug including a conductive material which fills a first connecting hole formed in said first insulating film;

an antioxidation film formed on said first insulating film;

a capacitor construction formed on said antioxidation film comprising a lower electrode, an upper electrode and a dielectric film therebetween;

a second insulating film having a laminated-layer construction including a first protective film and a second protective film for preventing degradations of the characteristics of said capacitor construction, said first protective film and said second protective film being laminated with a second interlayer insulating film interposed therebetween and said second insulating film being formed to cover said capacitor construction; and a second plug including a conductive material which fills a second connecting hole, said second connecting hole being formed in said second insulating film such that said first plug is exposed at least at a portion thereof;

wherein said antioxidation film is formed in contact with said second plug;

wherein said first protective film, which is made of alumina, is removed at least at the portion which corresponds to said second connecting hole and is not in contact with said second plug and said first protective film is formed to cover at least said capacitor construction; and wherein said second protective film is an insulating film, and said second plug is formed to penetrate said second protective film.

6. The semiconductor device according to claim 2, wherein a plurality of second plugs is formed between said capacitor construction and a neighboring capacitor construction.

* * * * *